(12) United States Patent
Okamoto

(10) Patent No.: US 8,921,902 B2
(45) Date of Patent: Dec. 30, 2014

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventor: Satoru Okamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/851,122

(22) Filed: Mar. 27, 2013

(65) Prior Publication Data

US 2013/0214393 A1    Aug. 22, 2013

Related U.S. Application Data

(62) Division of application No. 12/125,967, filed on May 23, 2008, now Pat. No. 8,420,456.

(30) Foreign Application Priority Data

Jun. 12, 2007 (JP) ................................. 2007-155620

(51) Int. Cl.
| | |
|---|---|
| *H01L 27/148* | (2006.01) |
| *H01L 27/12* | (2006.01) |
| *H01L 29/66* | (2006.01) |
| *H01L 29/49* | (2006.01) |
| *H01L 29/786* | (2006.01) |
| *G02F 1/1368* | (2006.01) |
| *H01L 27/13* | (2006.01) |

(52) U.S. Cl.
CPC ............ *H01L 29/786* (2013.01); *G02F 1/1368* (2013.01); *H01L 27/12* (2013.01); *H01L 27/13* (2013.01); *H01L 29/66757* (2013.01); *H01L 27/1214* (2013.01); *H01L 29/4908* (2013.01); *H01L 29/78696* (2013.01)
USPC .......................................... 257/240; 257/213

(58) Field of Classification Search
CPC ............ H01L 29/7854; H01L 29/7853; H01L 29/78696
USPC .................................................. 257/213, 240
See application file for complete search history.

(56) References Cited

U.S. PATENT DOCUMENTS

| 5,652,453 A | 7/1997 | Iwamatsu et al. |
| 5,905,286 A | 5/1999 | Iwamatsu et al. |

(Continued)

FOREIGN PATENT DOCUMENTS

| CN | 1507057 | 6/2004 |
| CN | 1855396 | 11/2006 |

(Continued)

OTHER PUBLICATIONS

Chinese Office Action (Application No. 200810125110.5;CN10697) Dated Jan. 18, 2012.

(Continued)

*Primary Examiner* — Jae Lee
(74) *Attorney, Agent, or Firm* — Nixon Peabody LLP; Jeffrey L. Costellia

(57) ABSTRACT

An object is to provide a semiconductor device with improved reliability in which a defect stemming from an end portion of a semiconductor layer provided in an island shape is prevented, and a manufacturing method thereof. Over a substrate having an insulating surface, an island-shaped semiconductor layer is formed, a first alteration treatment is performed, a first insulating film is formed on a surface of the island-shaped semiconductor layer, the first insulating film is removed, a second alteration treatment is performed on the island-shaped semiconductor from which the first insulating film is removed, a second insulating film is formed on a surface of the island-shaped semiconductor layer, and a conductive layer is formed over the second insulating film. An upper end portion of the island-shaped semiconductor layer has curvature by the first alteration treatment and the second alteration treatment.

6 Claims, 14 Drawing Sheets

(56) References Cited

U.S. PATENT DOCUMENTS

| | | |
|---|---|---|
| 6,144,072 A | 11/2000 | Iwamatsu et al. |
| 6,509,583 B1 | 1/2003 | Iwamatsu et al. |
| 6,521,510 B1 | 2/2003 | Fisher et al. |
| 6,653,656 B2 | 11/2003 | Iwamatsu et al. |
| 6,838,733 B2 | 1/2005 | Takehiro |
| 6,855,633 B2 | 2/2005 | Kotani |
| 7,001,822 B2 | 2/2006 | Iwamatsu et al. |
| 7,176,071 B2 | 2/2007 | Takehiro |
| 7,364,954 B2 | 4/2008 | Kuwashima et al. |
| 7,728,360 B2 | 6/2010 | Chen et al. |
| 7,948,037 B2 | 5/2011 | Chen et al. |
| 8,318,554 B2 | 11/2012 | Arai et al. |
| 2002/0008240 A1 | 1/2002 | Hirabayashi et al. |
| 2002/0137344 A1 | 9/2002 | Jordan et al. |
| 2003/0094625 A1 | 5/2003 | Yamazaki et al. |
| 2003/0107038 A1 * | 6/2003 | Iwamatsu et al. ............... 257/59 |
| 2004/0094793 A1 | 5/2004 | Noguchi et al. |
| 2004/0127066 A1 | 7/2004 | Jung |
| 2005/0116305 A1 | 6/2005 | Hwang et al. |
| 2006/0086934 A1 | 4/2006 | Iwamatsu et al. |
| 2006/0244063 A1 | 11/2006 | Isobe et al. |
| 2006/0246633 A1 | 11/2006 | Arai et al. |
| 2006/0246640 A1 | 11/2006 | Kuwashima et al. |
| 2006/0246644 A1 | 11/2006 | Isobe et al. |
| 2006/0246738 A1 | 11/2006 | Isobe et al. |
| 2006/0270066 A1 | 11/2006 | Imahayashi et al. |
| 2006/0275710 A1 | 12/2006 | Yamazaki et al. |
| 2007/0037352 A1 | 2/2007 | Suzawa et al. |
| 2007/0158700 A1 | 7/2007 | Koh et al. |
| 2007/0228420 A1 | 10/2007 | Takano et al. |
| 2008/0020528 A1 | 1/2008 | Kakehata et al. |
| 2009/0239352 A1 | 9/2009 | Kitagawa et al. |

FOREIGN PATENT DOCUMENTS

| | | |
|---|---|---|
| EP | 1 865 548 A | 12/2007 |
| JP | 3-022567 | 1/1991 |
| JP | 04-301623 A | 10/1992 |
| JP | 08-186265 | 7/1996 |
| JP | 8-335702 | 12/1996 |
| JP | 09-252114 | 9/1997 |
| JP | 2003-068844 | 3/2003 |
| JP | 2004-140274 | 5/2004 |
| JP | 2004-273922 | 9/2004 |
| JP | 2005-236202 | 9/2005 |
| JP | 2005-303052 A | 10/2005 |
| JP | 2006-332606 | 12/2006 |
| JP | 2006-339556 | 12/2006 |
| JP | 2007-142287 | 6/2007 |
| WO | WO 2006/106666 A1 | 10/2006 |

OTHER PUBLICATIONS

Chinese Office Action (Application No. 200810125110.5; CN 10697), dated Feb. 16, 2011.

S. Taylor et al., "A Review of the Plasma Oxidation of Silicon and Its Applications", (Semiconductor Science and Technology), Jan. 13, 1993, vol. 8, No. 7, pp. 1426-1433.

* cited by examiner

106

108
107

112a   111   112b 101 102a 102b 103

103 115

103

103 118

103

119 103

SEMICONDUCTOR DEVICE AND MANUFACTURING METHOD THEREOF

BACKGROUND OF THE INVENTION

1. Field of the Invention

The present invention relates to a semiconductor device and a manufacturing method of a semiconductor device. Note that in this specification, a semiconductor device refers to devices in general that function by utilizing a semiconductor characteristic.

2. Description of the Related Art

In recent years, manufacturing of semiconductor devices that utilize thin film transistors as switching elements, in which the thin film transistors (hereinafter also referred to as a "TFT") are formed over substrates having insulating surfaces, such as glass, has been actively pursued. In the thin film transistor, an island-shaped semiconductor layer is formed over a substrate that has an insulating surface, and a portion of the island-shaped semiconductor layer is used as a channel-forming region of the transistor.

Patent Document 1: Japanese Published Patent Application No. H8-335702

Patent Document 1: Japanese Published Patent Application No. H3-22567

SUMMARY OF THE INVENTION

However, with a thin film transistor that has an island-shaped semiconductor layer, there is concern of various defects occurring at an end portion of the semiconductor layer. For example, when the semiconductor layer is formed in an island shape, a step is formed at an end portion of the semiconductor layer, and coverage by a gate insulating film tends to be poor at the end portion of the semiconductor layer. For example, at the end portion of the island-shaped semiconductor layer, there is a case where the gate insulating film becomes thin locally. In a case where the end portion of the island-shaped semiconductor layer cannot be covered sufficiently by the gate insulating film, there is concern of a short circuit occurring between a conductive layer that serves as a gate electrode and the semiconductor layer, or a leak current occurring. Particularly in recent years, reduction in film thickness of gate insulating films is desired in order to reduce power consumption of thin film transistors as well as improve operation speed thereof, and when a gate insulating film is provided to be thin, a defect in coverage of an end portion of a semiconductor layer becomes an even more pronounced problem.

Further, at an end portion of an island-shaped semiconductor layer, particularly a region in which a conductive layer that serves as a gate electrode and the semiconductor layer overlap, an electric field concentrates easily at the end portion (corner portion). When an electric field concentrates, there is a problem of a leak current occurring due to dielectric breakdown or the like of the gate insulating film, formed between the conductive layer that serves as a gate electrode and the semiconductor layer. In addition, the defect in coverage by the gate insulating film also leads to electrostatic discharge (ESD) or the like of an element or the gate insulating film, and causes yield reduction in manufacturing a semiconductor device.

When a problem such as the above that stems from an end portion of a semiconductor layer occurs, an operational characteristic of a thin film transistor becomes degraded and reliability also decreases. Further, in manufacturing a semiconductor device, yield also decreases. In view of these problems, an object of the present invention is to provide a semiconductor device with a novel structure with improved reliability, and a manufacturing method thereof.

One aspect of a manufacturing method of the present invention is that an island-shaped semiconductor layer is formed over a substrate having an insulating surface, a first insulating film is formed on a surface of the island-shaped semiconductor layer by performing a first alteration treatment, the first insulating film is removed, a second insulating film is formed on a surface of the island-shaped semiconductor layer by performing a second alteration treatment on the island-shaped semiconductor layer from which the first insulating film is removed, and a conductive layer is formed over the second insulating film. Further, an upper end portion of the island-shaped semiconductor layer has curvature by the first alteration treatment and the second alteration treatment.

Another aspect of a manufacturing method of the present invention is that an island-shaped semiconductor layer is formed over a substrate having an insulating surface, a first insulating film is formed on a surface of the island-shaped semiconductor layer by performing a first alteration treatment, the first insulating film is removed, a second insulating film is formed on a surface of the island-shaped semiconductor layer by performing a second alteration treatment on the island-shaped semiconductor layer from which the first insulating film is removed, and a conductive layer is formed over the second insulating film. Further, an upper end portion and a lower end portion of the island-shaped semiconductor layer have curvatures by the first alteration treatment and the second alteration treatment.

Still another aspect of a manufacturing method of the present invention is that an island-shaped semiconductor layer is formed over a substrate having an insulating surface, a first insulating film is formed on a surface of the island-shaped semiconductor layer by performing a first alteration treatment, the first insulating film is removed, a second insulating film is formed on a surface of the island-shaped semiconductor layer by performing a second alteration treatment on the island-shaped semiconductor layer from which the first insulating film is removed, the second insulating film is removed, a third insulating film is formed on a surface of the island-shaped semiconductor layer by performing a third alteration treatment on the island-shaped semiconductor layer from which the second insulating film is removed, a conductive layer is formed over the third insulating film. Further, an upper end portion and a lower end portion of the island-shaped semiconductor layer by the first alteration treatment, the second alteration treatment, and the third alteration treatment.

Note that in this specification, an alteration treatment refers to an oxidation treatment, a nitridation treatment, an oxynitridation treatment, a surface modification treatment, or the like performed on a substrate, a semiconductor layer, an insulating film, or a conductive layer.

One aspect of a manufacturing method of the present invention is that a first alteration treatment, a second alteration treatment, and a third alteration treatment are plasma treatments. Note that in this specification, a plasma treatment includes in its category an oxidation treatment, a nitridation treatment, an oxynitridation treatment, and a surface modification treatment each using plasma, which is performed on a substrate, a semiconductor layer, an insulating film, or a conductive film.

One aspect of a manufacturing method of the present invention is that an island-shaped semiconductor layer has a film thickness of 10 nm to 30 nm inclusive.

Another aspect of a manufacturing method of the present invention is that an insulating film has a film thickness of 1 nm to 10 nm inclusive.

Further, one aspect of a structure of the present invention includes a substrate having an insulating surface, a semiconductor layer provided over the substrate, an insulating film formed so as to cover the semiconductor layer, and a conductive layer provided over the semiconductor layer with the insulating film interposed therebetween. Further, an upper end portion of a cross-section of the semiconductor layer has a rounded shape.

Another aspect of a structure of the present invention includes a substrate having an insulating surface, a semiconductor layer provided over the substrate, an insulating film formed so as to cover the semiconductor layer, and a conductive layer provided over the semiconductor layer with the insulating film interposed therebetween. Further, an upper end portion and a lower end portion of a cross-section of the semiconductor layer have rounded shapes.

Note that in this specification, an end portion refers to a rim portion (edge portion) of a semiconductor layer formed in an island shape.

One aspect of a structure of the present invention is that a semiconductor layer has a film thickness of 10 nm to 30 nm inclusive.

Another aspect of a structure of the present invention is that an insulating film has a film thickness of 1 nm to 10 nm inclusive.

Yet another aspect of a structure of the present invention is that when a film thickness of a semiconductor layer is t (t>0) and a curvature radius of an end portion of a cross-section of the semiconductor layer is r (r>0), a relationship of t and r satisfies a conditional formula $(t/2) \leq r \leq 2t$.

Still another aspect of a structure of the present invention is that when a film thickness of a semiconductor layer is t (t>0) and a curvature radius of an end portion of a cross-section of the semiconductor layer is r (r>0), a relationship of t and r satisfies a conditional formula $(t/4) \leq r \leq t$.

One aspect of a structure of the present invention is that an insulating film includes a material of a semiconductor layer.

By applying the present invention, a semiconductor layer can be reduced in thickness. Further, by an end portion of the semiconductor layer having curvature, a defect that stems from the end portion of the semiconductor layer can be reduced. Therefore, an effect that a characteristic of the end portion of the semiconductor layer has on the semiconductor device can be reduced, and a semiconductor device with improved reliability can be provided. In addition, in manufacturing a semiconductor device, yield can be improved.

DETAILED DESCRIPTION OF THE INVENTION

Embodiment Mode

Figure 1A:
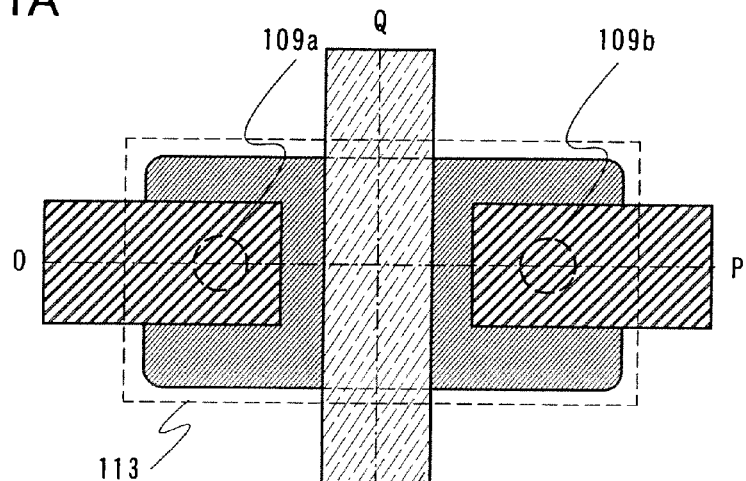
FIGS. 1A to 1C show an example of a main structure of a semiconductor device according to the present invention.

Embodiment modes of the present invention will be explained below with reference to the drawings. However, it is to be easily understood by those skilled in the art that the present invention is not limited to the description below and the modes and details of the present invention can be changed in various ways without departing from the spirit and scope of the present invention. Therefore, the present invention should not be interpreted as being limited to the description of the embodiment modes below. Note that in the following description of the present invention, reference numerals denoting identical portions may be used in common in different drawings.

Embodiment Mode 1

Figure 1B:
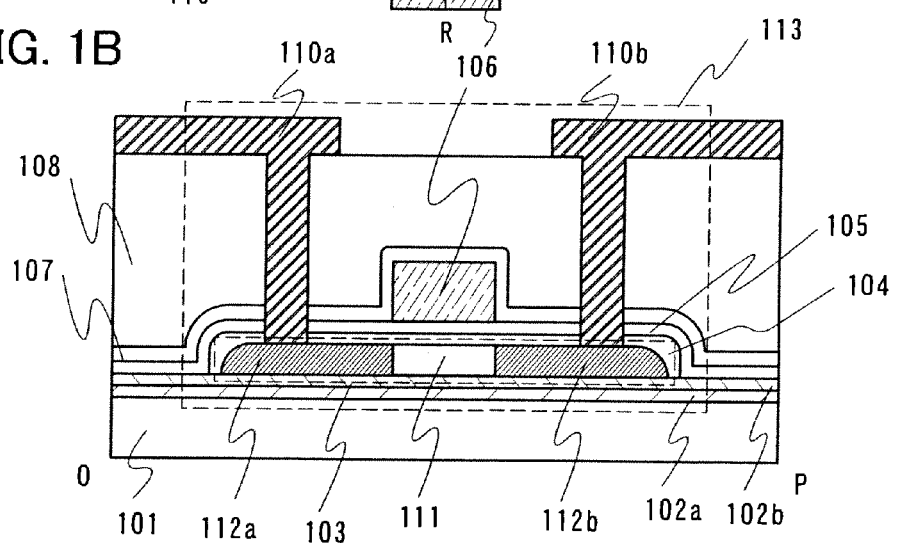
Figure 1C:
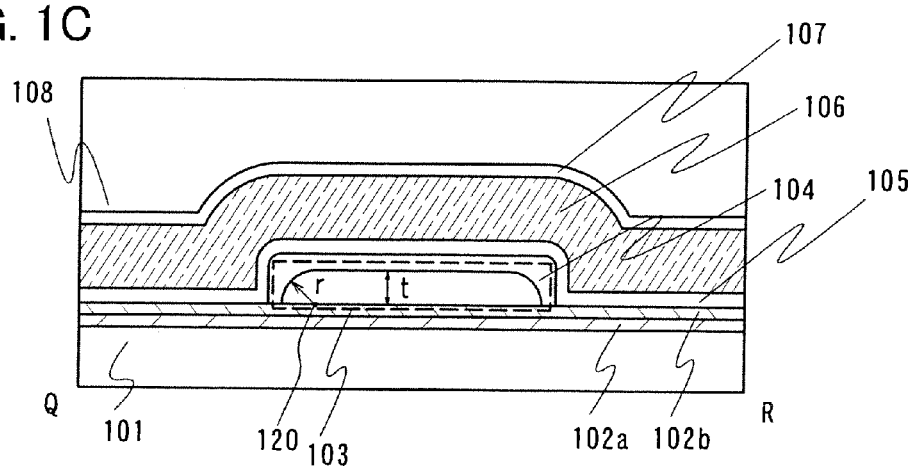

FIGS. 1A to 1C are a top view and cross-sectional views for describing a main structure of a semiconductor device according to the present invention. FIGS. 1A to 1C shows a structure of a thin film transistor in particular, and FIG. 1A shows the top view, FIG. 1B shows a cross-sectional view across a dashed line O-P in FIG. 1A, and FIG. 1C shows a cross-sectional view across a dashed line Q-R in FIG. 1A. Note that in FIG. 1A, a thin film or the like is partially omitted.

A thin film transistor 113 shown in FIGS. 1A to 1C includes a semiconductor layer 103 provided in an island shape over a substrate 101 with an insulating film 102a and an insulating film 102b interposed therebetween; an insulating film 104 and an insulating film 105 formed over the semiconductor layer 103, a conductive layer 106 that serves as a gate electrode that is provided over the insulating film 104 and the insulating film 105; and conductive layers 110a and 110b each serving as a source electrode or a drain electrode that are provided through an insulating film 107 and an insulating film 108 over the conductive layer 106.

As shown in FIGS. 1B and 1C, upper end portions of a cross-section of the semiconductor layer 103 are formed to have curvature. Further, upper end portions of the insulating films 104 and 105 provided over the semiconductor layer 103 are also formed to have curvature. By providing curvature in the cross-sectional upper end portions of the semiconductor layer 103, coverage by the insulating films 104 and 105 at the end portions of the semiconductor layer 103 can be good. Consequently, a defect stemming from a defect in coverage by the insulating films 104 and 105 at the end portions of the semiconductor layer 103, for example, a short circuit of the semiconductor layer and the gate insulating film, occurrence of a leak current, electrostatic breakdown, or the like can be prevented.

For the substrate 101, a glass substrate, a quartz substrate, a sapphire substrate, a ceramic substrate, a metal substrate with an insulating film formed on a surface, or the like can be used.

The semiconductor layer 103 is formed over the substrate 101. The insulating film 102a and the insulating film 102b serving as a base insulating film may be provided between the substrate 101 and the semiconductor layer 103. The base insulating film prevents contamination of the semiconductor layer 103 that is caused by diffusion of an impurity such as an alkali metal from the substrate 101, and may be provided as a blocking layer as appropriate. Further, the base insulating film may be provided as a film that smoothes a surface of the substrate 101 when the surface has asperity.

The insulating films 102a and 102b are formed using silicon oxide, silicon nitride, silicon oxynitride, silicon nitride oxide, or the like. Further, in this embodiment mode, although the base insulating film has a two-layer stacked-layer structure of the insulating films 102a and 102b, a single-layer structure or a stacked-layer structure with three or more layers may be employed. For example, as shown in this embodiment mode, in the case of a stacked-layer structure with two layers, a silicon nitride oxide layer can be formed as a first layer and a silicon oxynitride layer can be formed as a second layer. Further, a silicon nitride layer may be formed as the first layer and a silicon oxide layer may be formed as the second layer.

The semiconductor layer 103 is formed in an island shape. A variety of semiconductors can be used for the semiconductor layer 103, such as an amorphous semiconductor, a crystalline semiconductor, a polycrystalline semiconductor, or a microcrystalline semiconductor. Specifically, a semiconductor material such as silicon, germanium, or silicon-germanium can be used to form the semiconductor layer 103. The semiconductor layer 103 is formed to have a film thickness in the range of 10 nm to 150 nm inclusive, preferably 10 nm to 100 nm inclusive, and more preferably 10 nm to 30 nm inclusive.

By forming the semiconductor layer 103 to be a thin film of 50 nm or thinner, a TFT can be even more miniaturized. Further, even in a case of increasing an amount of the impurity element for doping the channel-forming region in order to make a threshold voltage of the TFT small, since manufacturing of a fully-depleted TFT is made easier by forming the semiconductor layer 103 as a thin film, a TFT with a small S value and a low threshold voltage can be manufactured.

The semiconductor layer 103 includes a channel-forming region 111 and impurity regions 112a and 112b each serving as a source region or a drain region. An impurity element imparting one conductivity type is added to each of the impurity regions 112a and 112b. Further, an impurity element imparting one conductivity type for controlling a threshold voltage of a transistor may be added to the channel-forming region 111. The channel-forming region 111 is formed in a region that roughly matches a location of the conductive layer 106 with the insulating film 104 and the insulating film 105 formed therebetween, and is also located between the impurity regions 112a and 112b.

In addition, a low-concentration impurity region that serves as a lightly doped drain (LDD) region may be formed in the semiconductor layer 103. The low-concentration impurity region can be formed between the channel-forming region 111 and the impurity regions 112a and 112b each serving as a source region or a drain region. Note that the low-concentration impurity region is to have a lower impurity concentration compared to those of the impurity regions 112a and 112b each serving as a source region or a drain region.

The insulating film 104 is formed to be in contact with the semiconductor layer 103, and the insulating film 105 is formed over the insulating film 104. In addition, the conductive layer 106 is formed over the insulating film 104 and the insulating film 105. The insulating film 104 and the insulating film 105 serve as a gate insulating film of the thin film transistor 113. That is, a gate insulating film according to the present invention can be formed as a single-layer structure or as a stacked-layer structure of two layers or more. Note that a border between the plurality of insulating films does not have to be clear.

As described above, when the semiconductor layer 103 is formed in an island shape, various defects stemming from the end portion of the semiconductor layer 103 occurs easily. For example, at an end portion of the semiconductor layer 103 that overlaps with the gate electrode, and at an end portion of the channel-forming region 111 formed in the semiconductor layer 103 where the semiconductor layer 103 overlaps with the gate electrode (around borders between the channel-forming region 111 and the impurity regions 112a and 112b each serving as a source region or a drain region), the defects easily occur and are easily effected by electrostatic breakdown, or the like.

As causes of the defects, the following can be given. In a region where an end portion of the channel-forming region 111 and the gate electrode overlap, a parasitic channel is easily formed through the gate insulating film that is in contact with a side surface of the end portion of the channel-forming region 111 (end portion of the semiconductor layer); a high voltage is applied to regions of the end portion of the channel-forming region 111 around the borders with the impurity regions 112a and 1126 each serving as a source region or a drain region compared to around the center of the channel-forming region 111; there is an effect of etching or the like that is performed in processing the gate electrode (conductive layer) formed in a layer above; and the gate insulating film is locally thin at the end portions of the semiconductor layer 103.

Therefore, by the end portions of the semiconductor layer 103 having curvature and having good coverage by the insulating layers 104 and 105 that serve as the gate insulating film, defects stemming from poor coverage by the insulating film at the end portions of the semiconductor layer 103, for example, a short circuit between the semiconductor layer and the gate electrode, occurrence of a leak current, electrostatic breakdown, or the like can be prevented.

In this specification, an "end portion" of the semiconductor layer refers to a rim portion (edge portion) of a semiconductor layer formed in an island shape.

When the thickness of the island-shaped semiconductor layer 103 is t (t>0) and the curvature radius at each of the end portions of the island-shaped semiconductor layer 103 is r (r>0), the relationship of t and r satisfies a conditional equation (t/2)≤r≤2t. Further, when the curvature radius of each of the end portions is r, a curvature center location 120 exists on a substrate side.

Each of the insulating film 104 and the insulating film 105 can be formed using a material such as silicon oxide, silicon nitride, silicon oxynitride, silicon nitride oxide, aluminum nitride, silicon oxide containing fluorine (SiOF), silicon oxide containing carbon (SiOC), diamond-like carbon (DLC), or porous silica.

The conductive layer 106 that serves as a gate electrode is formed over the semiconductor layer 103 with the insulating film 104 and the insulating film 105 interposed therebetween. The conductive layer 106 can be formed using a metal element such as tantalum, tungsten, titanium, molybdenum, chromium, aluminum, copper, or niobium, or an alloy material or compound material containing the metal element. As the compound material, a nitrogen compound, an oxygen compound, a carbon compound, a halogen compound, or the like can be used; specifically, tungsten nitride, titanium nitride, aluminum nitride, or the like can be given. The conductive layer 106 is formed using one or a plurality of these materials to have a single-layer structure or a stacked-layer structure. Further, the conductive layer 106 may be formed using polycrystalline silicon to which an impurity element imparting one conductivity type such as phosphorus is added, or the like.

The insulating film 107 and the insulating film 108 that serve as an interlayer insulating film are formed so as to cover the conductive layer 106. In this embodiment mode, the interlayer insulating film is formed as a stacked-layer structure of the insulating film 107 and the insulating film 108. Each of the insulating film 107 and the insulating film 108 can be formed using a silicon nitride film, a silicon nitride oxide film, a silicon oxynitride film, a silicon oxide film, or another insulating film containing silicon. The interlayer insulating film may be formed as a single-layer structure or a stacked-layer structure including three layers or more.

Further, contact holes (opening portions) 109a and 109b that reach the semiconductor layer 103 are formed in the insulating films 104, 105, 107, and 108. Also, the conductive layers 110a and 110b are formed so as to cover the contact holes 109a and 109b, respectively. Each of the conductive layers 110a and 110b serves as a source electrode or a drain electrode, and is electrically connected to a portion of the source region or drain region. Each of the conductive layers 110a and 110b is formed using a metal such as silver, gold, copper, nickel, platinum, lead, iridium, rhodium, tungsten, aluminum, tantalum, molybdenum, cadmium, zinc, iron, titanium, zirconium, or barium; Si or Ge; or an alloy or a nitride thereof. In addition, a stacked-layer structure thereof may be used.

A semiconductor device according to this embodiment mode can be even more miniaturized by forming a semiconductor layer to be a thin film of 50 nm or thinner. Further, by an end portion of the semiconductor layer having curvature, a defect stemming from the end portion of the semiconductor layer can be reduced. Consequently, a semiconductor device with high reliability can be manufactured. In addition, semiconductor devices can be manufactured with good yield.

Next, an example of a manufacturing method of the semiconductor device shown in FIGS. 1A to 1C is described in specific with reference to FIGS. 2A to 3C.

Figure 2A:
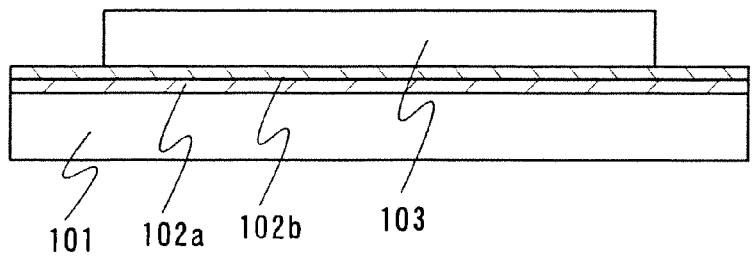
FIGS. 2A to 2E show an example of a manufacturing method of a semiconductor device according to the present invention.

First, the insulating films 102a and 102b that serve as a base insulating film are formed over the substrate 101, and the island-shaped semiconductor layer 103 is formed over the insulating films 102a and 102b (see FIG. 2A). As the substrate 101, a glass substrate, a quartz substrate, a sapphire substrate, a ceramic substrate, a metal substrate with an insulating film formed on a surface, or the like can be used.

Each of the insulating films 102a and 102b is formed by a CVD method, a sputtering method, an atomic layer deposition (ALD) method, or the like, using a material such as silicon oxide, silicon nitride, silicon oxynitride, or silicon nitride oxide. The insulating films 102a and 102b serve as blocking layers that prevent contamination of the semiconductor layer 103 that is caused by diffusion of an alkali metal or the like from the substrate 101. Further, the insulating films 102a and 102b serves as films that smooth a surface of the substrate 101 when the surface has asperity. Note that the insulating films 102a and 102b do not have to be formed if impurity diffusion from the substrate 101 and asperity of a substrate surface are not a problem. Also, although the base insulating film has a stacked-layer structure of two layers in this embodiment mode, it may have a single-layer structure or a stacked-layer structure of three or more layers.

For the semiconductor layer 103, an amorphous semiconductor manufactured by a vapor growth method or a sputtering method using a semiconductor material gas typified by silane or germane (hereinafter also referred to as "amorphous silicon (AS)"); a polycrystalline semiconductor made by crystallizing the amorphous semiconductor with light energy or heat energy; or a semi-amorphous (also called "microcrystal," and also referred to as "SAS" below) semiconductor can be used. For example, the island-shaped semiconductor layer 103 can be formed by crystallizing a semiconductor layer formed over an entire surface of the substrate 101 by a vapor growth method or a sputtering method, and then etching the semiconductor layer as selected.

As a material forming the semiconductor layer 103, it is preferable to use a material mainly containing silicon. Specifically, silicon, silicon-germanium, or the like can be used. Also, germanium may be used.

As a crystallization method of the semiconductor layer, a laser crystallization method, a heat crystallization method using rapid thermal annealing (RTA) or an annealing furnace; a crystallization method using a metal element that promotes crystallization; a method combining these methods; or the like can be used.

In the case of using a laser crystallization method, a laser beam emitted from a continuous wave laser (hereinafter also referred to as a "CW laser") or a pulsed wave laser (hereinafter also referred to as a "pulsed laser") can be used. As a laser which can be used here, a gas laser such as an Ar laser, a Kr laser, an excimer laser, a copper vapor laser, or a gold vapor laser, or a solid-state laser such as a laser whose medium is single-crystal YAG, YVO$_4$, or forsterite (Mg$_2$SiO$_4$), YAlO$_3$, or GdVO$_4$, to which one or more of Nd, Yb, Cr, Ti, Ho, Er, Tm, and Ta has been added as a dopant, or polycrystalline (ceramic) YAG, Y$_2$O$_3$, YVO$_4$, YAlO$_3$, or GdVO$_4$, to which one or more of Nd, Yb, Cr, Ti, Ho, Er, Tm, and Ta has been added as a dopant; a glass laser; an alexandrite laser; a ruby laser; or a Ti:sapphire laser; or the like can be given. In the case of using the solid-state laser, any of the fundamental wave to fourth harmonic thereof can be selected as appropriate for irradiation. For example, the second harmonic (532 nm) or the third harmonic (355 nm) of an Nd:YVO$_4$ laser (the fundamental wave: 1064 nm) can be used. When an Nd:YVO$_4$ laser is used as a CW laser, a laser power density of about 0.01 to 100 MW/cm$^2$ (preferably, 0.1 to 10 MW/cm$^2$) is required, and irradiation is conducted with a scanning rate of about 10 to 2000 cm/sec. Note that the second harmonic (532 nm) is preferably used here; this is because the second harmonic is superior in energy efficiency to the harmonics higher than this.

When laser crystallization is performed using a CW laser, a semiconductor layer continuously receives energy; therefore, once the semiconductor layer is melted, the melted state can be continuous. Therefore, it is possible to move a solid-liquid interface of the semiconductor layer by scanning with a CW laser beam and to form a crystal grain which is elongated in one direction along this scanning direction. A solid-state laser is preferably used because its output is so stable that a stable process can be expected compared to a gas laser or the like. By using not only a CW laser but also a pulsed laser with a repetition rate of greater than or equal to 10 MHz, the similar effect can be obtained. In the case of a pulsed laser with a high repetition rate, when the pulse interval of the laser is shorter than the period after the semiconductor layer is melted and before the melted semiconductor layer is solidified, the semiconductor layer can be maintained in a melted state at all times. Also, by movement of the solid-liquid interface, a semiconductor layer including a crystal grain which is elongated in one direction can be formed. Moreover, oscillation of a laser beam with $TEM_{00}$ (single transverse mode) is preferable because the energy homogeneity of a linear beam spot on an irradiation surface can be improved.

The semiconductor layer 103 can be formed into an island-shape by the steps of covering the semiconductor layer formed over the entire surface of the substrate with a mask made of a resist as selected and etching the semiconductor layer not covered with the mask made of a resist. The semiconductor layer can be etched by a dry etching method or a wet etching method. In the case of dry etching, an etching gas with high etching selectivity respect to the base insulating film is used. That is, an etching gas with a low etching rate with respect to the insulating films 102a and 102b and a high etching rate with respect to the semiconductor layer 103 may be used. As an etching gas, for example, a chlorine-based gas such as $Cl_2$, $BCl_3$, or $SiCl_4$, a fluorine-based gas such as $CF_4$, $NF_3$, or $SF_6$, or a bromine-based gas such as HBr gas can be used. Further, an inert gas such as He, Ar, Ne, Kr, or Xe may be added as appropriate. Furthermore, an $O_2$ gas may be added to a fluorine-based gas as appropriate. After the semiconductor layer is processed into a desired shape, the mask is removed.

The island-shaped semiconductor layer 103 may be formed such that a cross section of the end portion has a tapered form that is nearly at a right angle, or a tapered form with a gentle incline. For example, the end portion may be tapered such that a taper angle is greater than or equal to 45° and less than 95°, preferably, greater than or equal to 60° and less than 95°, or may be tapered with a gentle incline such that a taper angle is less than 45°. The shape of the end portion of the semiconductor layer 103 can be selected as appropriate by changing the etching condition or the like.

Note that for the semiconductor layer 103, an SOI substrate of which a single-crystal semiconductor layer is provided over an insulating surface may be used instead of performing a thin film process that uses various crystallization methods. In this case, the semiconductor layer 103 can be formed using the single crystal semiconductor layer provided over the insulating surface.

Figure 2B:
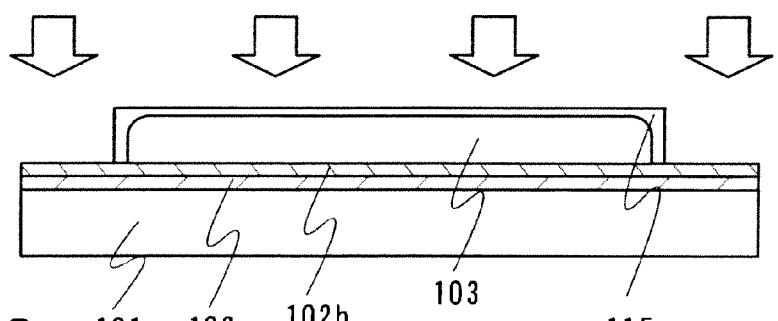

Next, as shown in FIG. 2B, an insulating film 115 is formed on a surface of the semiconductor layer 103 by performing an alteration treatment on the semiconductor layer 103. Here, the alteration treatment refers to an oxidation treatment, a nitridation treatment, an oxynitridation treatment, a surface modification treatment, or the like performed on a substrate, a semiconductor layer, an insulating film, and a conductive layer. A desired treatment may be performed in a region of the semiconductor layer 103 where the insulating film 115 is to be formed. Specifically, a thermal oxidation treatment, a treatment with a solution that has strong oxidative power such as ozone water, a plasma treatment, or the like is performed on a surface of the semiconductor layer 103, so that an oxide of the semiconductor layer 103 is formed on the semiconductor layer 103. This also applies to cases of forming a nitride, an oxynitride, and a nitride oxide of the above semiconductor layer 103. By forming the insulating film 115, the semiconductor layer 103 can be reduced in thickness. Note that by performing a plasma treatment on the semiconductor layer 103, controlling a thickness of the insulating film 115 becomes easy.

Figure 2C:
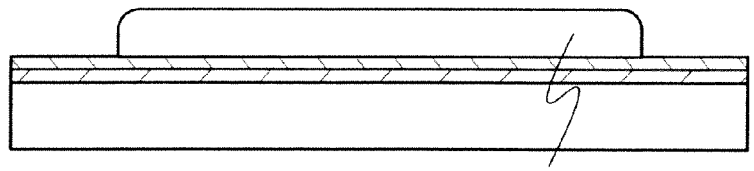

Next, as shown in FIG. 2C, the insulating film 115 is removed by etching. A method of removing the insulating film 115 may be dry etching or wet etching. For example, in a case of performing dry etching, chlorine-based gas such as $Cl_2$, $BCl_3$, or $SiCl_4$, a fluorine-based gas such as $CF_4$, $NF_3$, or $SF_6$, fluorocarbon gas such as $CHF_3$, $C_5F_8$, or $C_4F_8$, or a bromine-based gas such as HBr gas can be used as an etching gas. Further, an inert gas of He, Ar, Xe, or the like may be added as appropriate. Furthermore, $O_2$ gas or $H_2$ gas may be added to a fluorine-based gas. In this embodiment mode, a mixed gas of $C_4F_8$ and He is used for dry etching. The semiconductor layer 103 can be reduced in thickness by performing an alteration treatment on the semiconductor layer 103 to form an insulating film on the surface of the semiconductor layer 103 and then removing the insulating film 115. After etching, the semiconductor layer 103 is reduced in thickness, and an end portion of the semiconductor layer comes to have curvature.

Figure 2D:
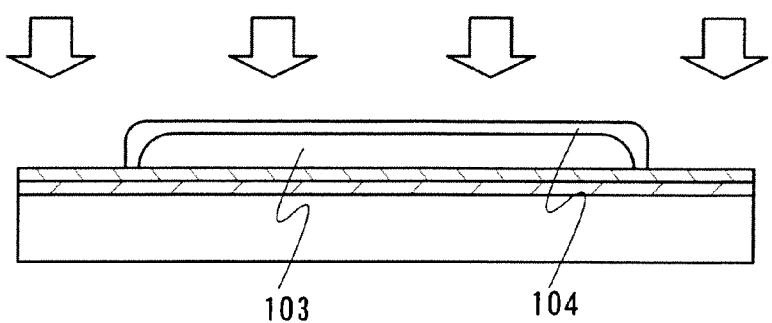

Next, as shown in FIG. 2D, an alteration treatment is further performed on the semiconductor layer 103 from which the insulating film 115 is removed, to form the insulating film 104 on the surface of the semiconductor layer 103. A method of performing the alteration treatment on the semiconductor layer 103 to form the insulating film 104 is similar to the case of forming the insulating film 115. By performing the alteration treatment on the semiconductor layer 103 to form the insulating film 104, the semiconductor layer 103 can be reduced in thickness even more, and the end portion of the semiconductor layer 103 can have even more curvature.

Note that when the thickness of the island-shaped semiconductor layer 103 is t (t>0) and the curvature radius of a cross-section of each of the end portions of the island-shaped semiconductor layer 103 is r (r>0), the relationship of t and r satisfies a conditional equation $(t/2) \le r \le 2t$. Further, when the curvature radius of each of the end portions is r, a curvature center location 120 exists on a substrate side.

A thickness of the semiconductor layer 103 after being reduced in thickness is in the range of 0.5 nm to 200 nm inclusive, preferably 1 nm to 50 nm inclusive, and more preferably 1 nm to 10 nm inclusive.

Figure 2E:
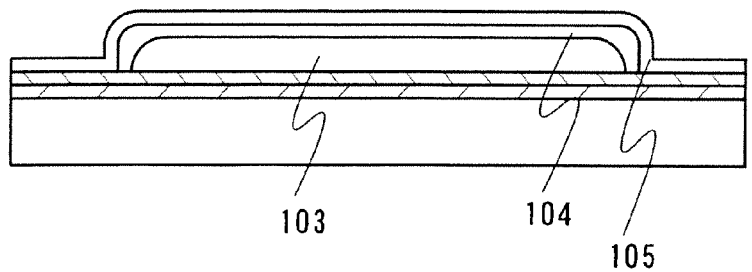

Next, as shown in FIG. 2E, the insulating film 105 is formed over the insulating film 102b and the insulating film 104. The insulating film 105 is formed by a CVD method, a sputtering method, an ALD method, or the like, using silicon oxide, silicon nitride, silicon oxynitride, silicon nitride oxide, aluminum nitride, or the like. A thickness of the insulating film 105 is in the range of 1 nm to 50 nm inclusive, preferably 1 nm to 20 nm inclusive, and more preferably 1 nm to 10 nm inclusive.

The insulating film 104 and the insulating film 105 formed in the above manner can be used as a gate insulating film. Note that the insulating film 104 can be used alone as the gate insulating film, or the insulating film 105 can be used alone as the gate insulating film by forming the insulating film 105 after removing the insulating film 104. In this embodiment mode, the gate insulating film is to have a stacked-layer structure of the insulating film 104 and the insulating film 105. By performing the alteration treatment on the semiconductor layer 103 and forming the insulating film 104 on the surface of the semiconductor layer 103, coverage of the insulating film 104 that serves as the gate insulating film can be good. Further, the semiconductor layer can be covered sufficiently even in a case where the insulating films (the base insulating film) at a lower end portion of the semiconductor layer or a periphery thereof is removed, due to an effect of a cleaning process using hydrofluoric acid or the like that accompanies etching for processing the semiconductor layer into an island shape and various processes. Consequently, a short circuit between the semiconductor layer and the gate insulating film, occurrence of a leak current, electrostatic breakdown, or the like that stems from a defect in coverage by the gate insulating film at the end portions of the semiconductor layer can be prevented.

Figure 3A:
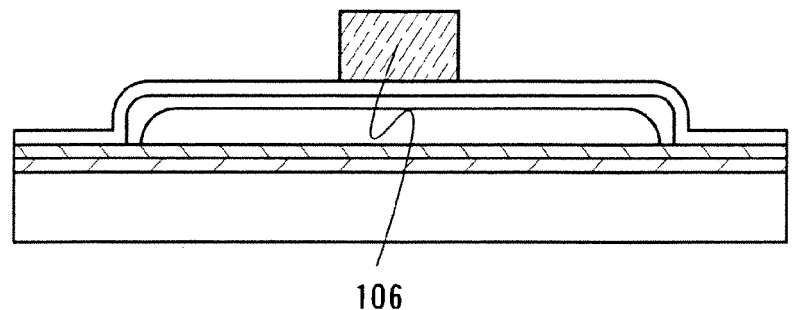
FIGS. 3A to 3C show an example of a manufacturing method of a semiconductor device according to the present invention.

Next, as shown in FIG. 3A, the conductive layer 106 that serves as a gate electrode is formed over the semiconductor layer 103 with the insulating film 104 and the insulating film 105 therebetween. The conductive layer 106 that serves as a gate electrode is formed by forming a conductive layer over an entire substrate by a CVD method or a sputtering method using a conductive material, and then processing into a desired shape by etching the conductive layer as selected. For the conductive material, a metal element such as tantalum, tungsten, titanium, molybdenum, chromium, aluminum, copper, or niobium; or an alloy or compound material containing the metal element can be used. In addition, a semiconductor material typified by polycrystalline silicon to which an impurity element imparting one conductivity type such as phosphorus is added, can be used. The conductive layer 106 is formed as a single-layer structure or a stacked-layer structure using these conductive materials. The conductive layer 106 that serves as a gate electrode is formed to have a film thickness in the range of 50 nm to 1000 nm inclusive, preferably 100 nm to 800 nm inclusive, and more preferably 200 nm to 500 nm inclusive.

In this embodiment mode, as the conductive layer 106 that serves as a gate electrode, a stacked-layer structure including a tantalum nitride layer with a film thickness of 30 nm and a tungsten layer with a film thickness of 370 nm is formed. By using an inductively coupled plasma (ICP) etching method and adjusting an etching condition as appropriate (such as an amount of electrical energy applied to a coil-shaped electrode layer, an amount of electrical energy applied to an electrode layer on a substrate side, or a temperature of an electrode on the substrate side), the conductive layer 106 can be etched such that a cross section thereof has a desired tapered form. In this embodiment mode, etching is performed on the tungsten layer using an etching gas including $CF_4$, $Cl_2$, and $O_2$, and ICP etching is performed on the tantalum nitride layer using an etching gas including $SF_6$, $Cl_2$, and $O_2$. The tantalum nitride layer and the tungsten layer of the conductive layer 106 may have widths that are roughly the same, or the conductive layer 106 may have a slanted side surface. Further, a dry etching apparatus used in the present invention is not limited to an ICP etching apparatus, and a parallel plate type etching apparatus, a microwave etching apparatus, or an electron cyclotron resonance (ECR) etching apparatus may be used. Note that a conductive layer (tantalum nitride layer) of a lower layer may be formed to be wider than a conductive layer of an upper layer (tungsten layer). Further, a sidewall may be formed in contact with a side surface of the gate electrode.

Figure 3B:
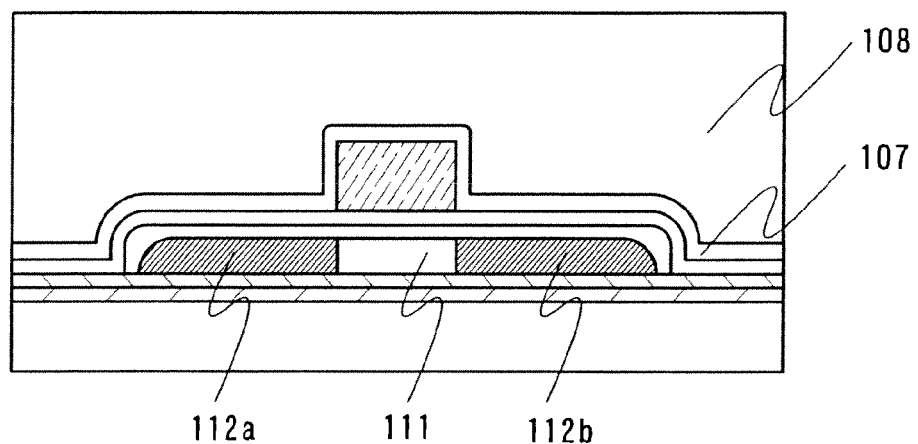

Next, as shown in FIG. 3B, an impurity element imparting one conductivity type is added using the conductive layer 106 as a mask, to form the impurity regions 112a and 112b having one conductivity type each serving as a source region or a drain region. In addition, the channel-forming region 111 is formed in the semiconductor layer 103. The impurity element imparting one conductivity type may be an impurity element imparting n-type conductivity (for example, phosphorus, arsenic, or the like) or an impurity element imparting p-type conductivity (for example, boron, aluminum, gallium, or the like). In this embodiment mode, phosphorus that is an impurity element imparting n-type conductivity is used as the impurity element imparting one conductivity type. Here, phosphorus is added to the impurity regions having one conductivity type each serving as a source region or a drain region, so that phosphorus is contained with a concentration of about $5 \times 10^{19}$ to $5 \times 10^{20}/cm^3$.

Further, an LDD region may be included in each of the impurity regions 112a and 112b in addition to the source region or drain region. The LDD region may be formed so as to overlap with the gate electrode.

In addition, an impurity element imparting one conductivity type for controlling a threshold voltage of a transistor may be added to the channel-forming region 111. By adding an impurity element with a predetermined concentration to the channel-forming region 111, the threshold voltage of the transistor can be forced to shift to a desired threshold voltage. As the impurity element imparting one conductivity type, an element imparting p-type conductivity such as boron, aluminum, or gallium, or an element imparting n-type conductivity such as phosphorus or arsenic can be used. In this embodiment mode, an element imparting p-type conductivity can be used; for example, boron can be added at a concentration of about $1 \times 10^{16}$ cm$^{-3}$ to $1 \times 10^{18}$ cm$^{-3}$. Note that the impurity element can be added to the channel-forming region 111 before forming the conductive layer 106.

Note that after the impurity element imparting one conductivity type is added to the semiconductor layer 103, a heat treatment is preferably performed to activate the impurity element that is added. The heat treatment can be performed using laser beam irradiation, RTA, or furnace annealing. Specifically, the heat treatment may be performed in the temperature range of 400° C. to 700° C. inclusive, preferably 500° C. to 650° C. inclusive. Also, the heat treatment is preferably performed in a nitrogen atmosphere. For example, activation can be carried out by performing heating for four hours at 550° C.

Next, an interlayer insulating film is formed so as to cover the insulating films and conductive layer provided over the substrate 101. In this embodiment mode, the interlayer insulating film is a stacked-layer structure of the insulating film 107 and the insulating film 108 (see FIG. 3B). Each of the insulating film 107 and the insulating film 108 is formed by a CVD method, a sputtering method, an ALD method, a coating method, or a combination method thereof, using an inorganic insulating material such as silicon oxide, silicon nitride, silicon oxynitride, or silicon nitride oxide; an insulating material containing carbon such as diamond-like carbon (DLC); an organic insulating material such as epoxy, polyimide, polyamide, polyvinylphenol, benzocyclobutene, or acrylic; or a siloxane material such as siloxane resin. Note that the siloxane material refers to a material including a Si—O—Si bond. A skeleton structure of siloxane includes a bond between silicon and oxygen. As a substituent group, an organic group containing at least hydrogen (for example, an alkyl group or aromatic hydrocarbon) is used. As the substituent group, at least a fluoro group may be used. Further, the insulating film 107 may be formed by forming an insulating film using a CVD method, a sputtering method, an ALD method, or the like, and then performing a high-density plasma treatment on the insulating film in an oxygen atmosphere or a nitrogen atmosphere. Note that here, although a two-layer stacked-layer structure of the insulating film 107 and the insulating film 108 is formed over the gate electrode, the interlayer insulating film may have a single-layer structure or a stacked-layer structure of three layers or more. When the interlayer insulating film is to have a stacked-layer structure, the insulating film in a lower layer (a side that is in contact with the gate electrode) is preferably formed using an inorganic insulating material. In this embodiment mode, the insulating film 107 is formed by a CVD method using silicon nitride, and the insulating film 108 is formed by applying siloxane on the insulating film 107.

Next, contacts holes (opening portions) that reach the semiconductor layer 103 are formed in the insulating film 104, the insulating film 105, the insulating film 107, and the insulating film 108 using a mask made of a resist. Etching for forming the contact holes may be performed once or a plurality of times depending on selectivity of the materials used for the insulating films. The insulating film 104, the insulating film 105, the insulating film 107, and the insulating film 108 are removed by etching, and the contact holes that reach the source region and the drain region can be formed. The etching may be wet etching or dry etching, or both may be employed. An etchant for the wet etching may be a fluorine-based solution such as a mixed solution of ammonium hydrogenfluoride and ammonium fluoride. As an etching gas, a fluorocarbon gas typified by $CHF_3$, $C_5F_8$, $C_4F_8$, or the like; a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be used as appropriate. In addition, an inert gas may be added to the etching gas to be used. As the inert gas to be added, one or a plurality of elements selected from He, Ne, Ar, Kr, and Xe can be used. In this embodiment mode, the contact holes are formed by etching the insulating film 107 and the insulating film 108 using $CF_4$, $O_2$, and He, and performing ICP etching on the insulating film 104 and the insulating film 105 using $C_4F_8$ and He.

Figure 3C:
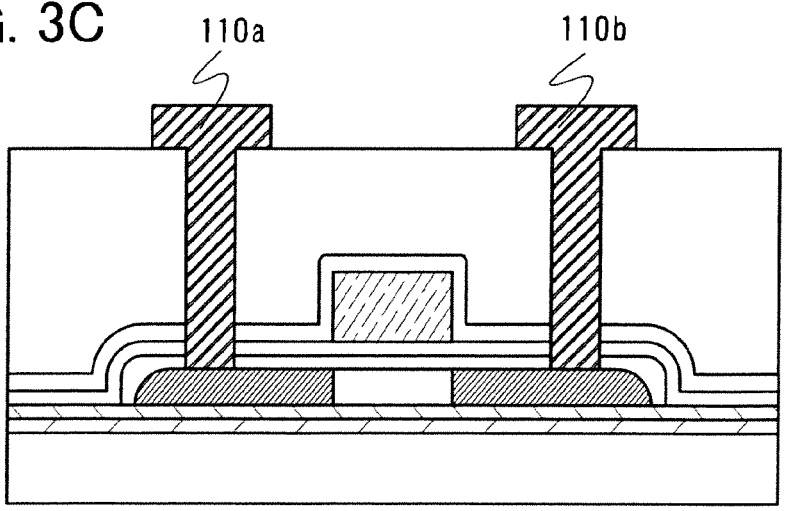

Next, as shown in FIG. 3C, a conductive layer is formed so as to cover the contact holes, and the conductive layer is etched to form the conductive layers 110a and 110b each functioning as a source electrode or a drain electrode that is electrically connected with a portion of the source region or the drain region. The conductive layers 110a and 110b can be formed by forming a conductive layer by a PVD method, a CVD method, an evaporation method, or the like, and then etching the conductive layer into a desired shape. Further, the conductive layer 110a and 110b can be formed into a predetermined place as selected, by a droplet discharging method, a printing method, an electrolytic plating method, or the like. Furthermore, a reflow method or a damascene method may be used.

The conductive layers 110a and 110b each serving as a source electrode or a drain electrode are formed to have a single-layer structure or a stacked-layer structure of two layers or more by a CVD method or a sputtering method, using a metal element selected from aluminum, tungsten, titanium, tantalum, molybdenum, nickel, platinum, copper, gold, silver, manganese, and neodymium, or an alloy material or compound material including the metal element. As an alloy material containing aluminum, a material mainly containing aluminum that contains nickel, or an alloy material mainly containing aluminum that contains nickel and one or both of carbon and silicon can be given. For the conductive layers 110a and 110b, for example, a stacked-layer structure of a barrier layer, an aluminum silicon layer, and a barrier layer, or a stacked-layer structure of a barrier layer, an aluminum silicon layer, a titanium nitride layer, and a barrier layer can be employed. Note that the barrier layer refers to a thin film made of titanium, a nitride of titanium, molybdenum, or a nitride of molybdenum. Aluminum or aluminum silicon is most suited as a material for forming the conductive layers 110a and 110b because it has a low resistance value and is inexpensive. Further, when barrier layers of an upper layer and a lower layer are provided, diffusion of aluminum or aluminum silicon to the semiconductor layer or occurrence of hillock can be prevented.

In this embodiment mode, for the conductive layers 110a and 110b, a stacked-layer structure of a 60 nm thick titanium layer, a 40 nm thick titanium nitride layer, a 300 nm thick aluminum layer, and a 100 nm thick titanium layer is formed and then ICP etching is performed on the stacked-layer structure using $Cl_2$ and $BCl_3$ to form a source electrode and a drain electrode.

Accordingly, the thin film transistor 113 to which the present invention is applied can be formed. Note that the structure of the transistor shown in this embodiment mode is one example, and the structure is not limited to that shown in the figures.

In a semiconductor device manufactured by applying the present invention, a semiconductor layer is reduced in thickness, and a channel-forming region is formed in a region where the thickness is reduced. Consequently, since it is possible to reduce a sub-threshold value and reduce a threshold voltage of a transistor, an operation characteristic of the semiconductor device can be improved. Further, by making an end portion of the semiconductor layer have curvature by a thinning process of the semiconductor layer, coverage by an insulating film formed over the semiconductor layer can be improved. Accordingly, since a defect stemming from the end portion of the semiconductor layer can be reduced, a semiconductor device with high reliability can be manufactured. Therefore, a semiconductor device with enhanced performance is possible.

Embodiment Mode 2

In this embodiment mode, an example of manufacturing a semiconductor device is described with reference to FIGS. 4A to 6C, in which when forming an insulating film on a semiconductor layer by performing an alteration treatment, the insulating film is formed on a surface of the semiconductor layer by a plasma treatment. Note that a description of a structure that is the same as in the above embodiment mode 1 is simplified and partially omitted.

Figure 5A:
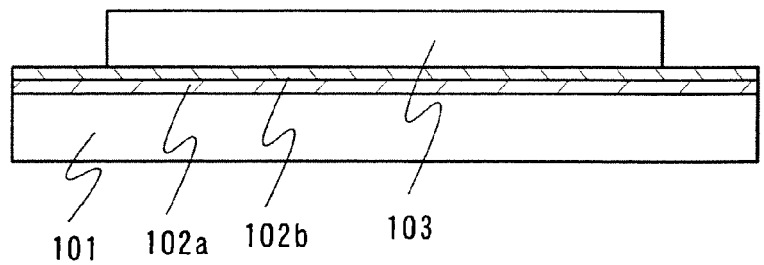
FIGS. 5A to 5E show an example of a manufacturing method of a semiconductor device according to the present invention.

Up through forming the island-shaped semiconductor layer 103 over the substrate 101 with the insulating films 102a and 102b therebetween is in accordance with the description made in the above embodiment mode 1 about the substrate 101, the insulating films 102a and 102b, the semiconductor layer 103, and the like; therefore, description thereof is omitted (see FIG. 5A).

Figure 4A:
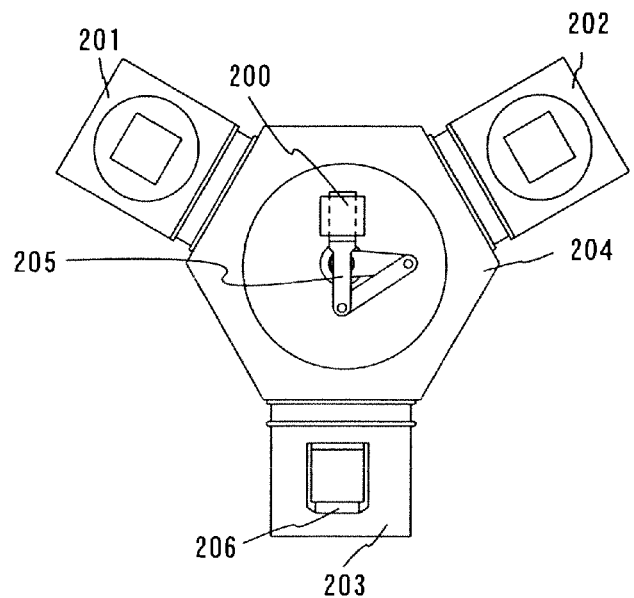
FIGS. 4A and 4B show an apparatus capable of oxidation by plasma treatment and nitridation by plasma treatment.
Figure 4B:
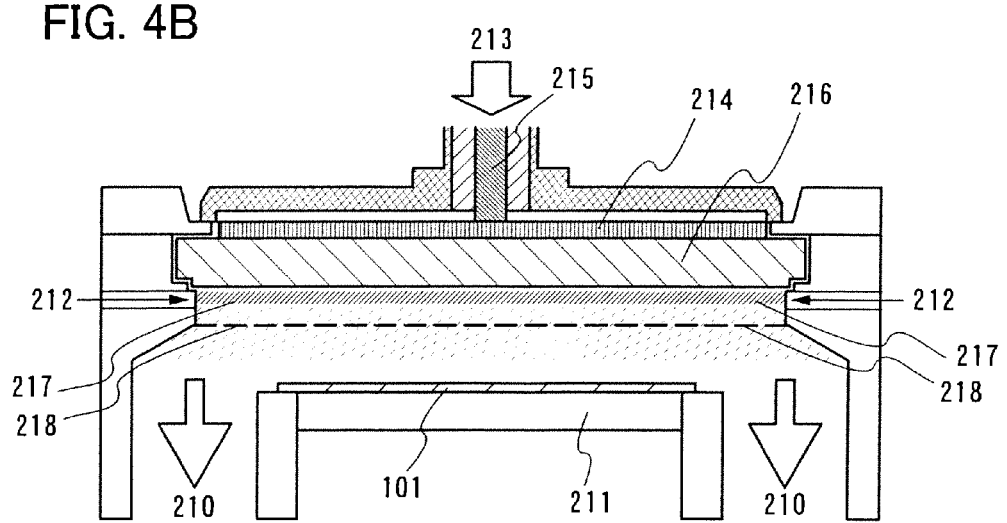
Figure 5B:
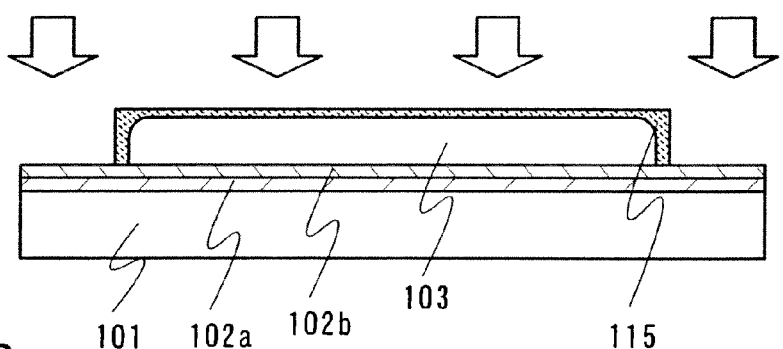

As shown in FIG. 5B, an alteration treatment is performed on the semiconductor layer 103 to form the insulating film 115 on the surface of the semiconductor layer 103. The insulating film 115 is formed by performing a plasma treatment using a high-density plasma treatment apparatus shown in FIGS. 4A and 4B. FIGS. 4A and 4B show one example of a high-density plasma treatment apparatus, and a structure thereof is not limited to that shown in the figures.

The high-density plasma treatment apparatus used in this embodiment mode is described below. As shown in FIG. 4A, the high-density plasma treatment apparatus includes at least a first plasma treatment chamber 201, a second plasma treatment chamber 202, a load lock chamber 203, and a common chamber 204. In the first plasma treatment chamber 201, oxidation by plasma treatment is performed, and in the second plasma treatment chamber 202, nitridation by plasma treatment is performed. Each chamber in FIG. 4A is evacuated, and the oxidation by plasma treatment and the nitridation by plasma treatment can be performed successively without exposure to air. In additions to what is shown in FIG. 4A, the high-density plasma treatment apparatus may also include at least one of a CVD chamber, a sputtering chamber, and a heat annealing chamber, which make it possible to successively perform film formation and a plasma treatment, and a plasma treatment and heat annealing, without exposure to air. Since a unit for generating a magnetic field such as a magnet or a coil is not provided in a periphery of the first plasma treatment chamber 201 and the second plasma treatment chamber 202, the apparatus can be simplified.

In the common chamber 204, a robot arm 205 is provided. In the load lock chamber 203, a cassette 206 which stores a plurality of the substrates 101 shown in FIG. 5A is provided. One of the substrates 101 stored in the cassette 206 can be carried by the robot arm 205 to the first plasma treatment chamber 201 or the second plasma treatment chamber 202 through the common chamber 204. Further, by the robot arm 205, the substrate 101 can be carried to the second plasma treatment chamber 202 from the first plasma treatment chamber 201 through the common chamber 204, or the substrate 101 can be carried to the first plasma treatment chamber 201 from the second plasma treatment chamber 202 through the common chamber 204.

FIG. 4B shows a structure that is common between the first plasma treatment chamber 201 and the second plasma treatment chamber 202. To each of the first plasma treatment chamber 201 and the second plasma treatment chamber 202, a vacuum pump (not shown in figure) with which pressure reduction to a certain pressure is possible is connected, and exhaust gas is discharged from an exhaust opening 210. Further, a substrate holder 211 is provided for each of the first plasma treatment chamber 201 and the second plasma treatment chamber 202, and the substrate 101 on which oxidation by plasma treatment or nitridation by plasma treatment is performed is held by the substrate holder 211. This substrate holder 211 is also called a stage, and it is provided with a heater so that the substrate 101 can be heated. A gas such as oxygen, nitrogen, hydrogen, a rare gas, or ammonia is introduced into the plasma treatment chamber from a gas introduction port as shown by arrows 212. A microwave 213 for exciting plasma is introduced through a wave-guide tube 215 that is provided over an antenna 214. The plasma is generated in a region 217 shown by diagonal lines immediately below a dielectric plate 216 when pressure within the plasma treatment chamber after introducing the above gas is 5 Pa to 500 Pa, and the plasma is supplied over the substrate 101 which is provided away from the region shown by the diagonal lines. A shower plate 218 provided with a plurality of holes may be provided as shown in FIG. 4B. The plasma that is obtained in this plasma treatment chamber has an electron temperature of 1.5 eV or lower and an electron density of $1\times10^{11}$ cm$^{-3}$ or higher; in other words, the plasma has a low electron temperature and a high electron density, and a plasma potential is 0 V to 5 V inclusive. Plasma meters regarding electron temperature, electron density, and plasma potential can be measured using a known method, for example a probe measuring method such as a double probe method.

In this embodiment mode, oxygen, hydrogen, and argon are introduced into the first plasma treatment chamber 201 so that a flow ratio is $O_2:H_2:Ar=1:1:100$, and plasma is generated using a microwave with a frequency of 2.45 GHz. Although oxidation by plasma treatment is possible without necessarily introducing hydrogen, it is preferable that a ratio of a flow amount of hydrogen to a flow amount of oxygen ($H_2O_2$) is in the range of 0 to 1.5 inclusive. The flow amount of oxygen is set for example in the range of 0.1 sccm to 100 sccm inclusive, and the flow amount of argon is set for example in the range of 100 sccm to 5000 sccm inclusive. If hydrogen is introduced, the flow amount of hydrogen is set for example in the range of 0.1 sccm to 100 sccm inclusive. A different rare gas may be introduced instead of argon. Pressure within the first plasma treatment chamber 201 is set at an appropriate value in the range of 5 Pa to 500 Pa inclusive. The substrate 101 is set on the substrate holder 211 in the first plasma treatment chamber 201, and a temperature of the heater provided to the substrate holder 211 is maintained at 400° C. Then, oxidation by plasma treatment is performed on the semiconductor layer 103 over the substrate 101. In this embodiment mode, as apparent from FIG. 5B, a portion of the base insulating film that is not covered by the semiconductor layer 103 is also oxidized by the plasma treatment. However, in a case where the base insulating film is made of an oxide, an oxide film is not formed on a surface of the base insulating film even when oxidation by plasma treatment is performed.

By the above oxidation by plasma treatment, the insulating film 115 made of an oxide film, as shown in FIG. 513, is formed on the surface of the semiconductor layer 103 so as to have a thickness of 20 nm or less. In the insulating film 115, argon that is introduced to the first plasma treatment chamber 201 is included at a predetermined concentration, for example, $1\times10^{15}$ atoms/cm$^3$ to $1\times10^{16}$ atoms/cm$^3$ inclusive. In forming the insulating film 115, the thickness of the insulating film formed at the end portion of the semiconductor layer 103 does not become thinner than other portions. Further, at that end portion, the insulating film 115 does not crack either. In a case of using a plastic substrate with heat resistance instead of a glass substrate, the temperature of the heater provided to the substrate holder 211 is maintained at 250° C., for example.

Since the plasma over the semiconductor layer 103 has an electron temperature of 1.5 eV or lower and an electron density of $1\times10^{11}$ cm$^{-3}$ or higher, and since a region where plasma is generated is away from the semiconductor layer, plasma damage to the insulating film due to the oxidation by plasma treatment is suppressed. By using a microwave of 2.45 GHz for generating plasma instead of that with a frequency of 13.56 MHz, low electron temperature and high electron density can be realized easily. Further, if low electron temperature and high electron density can be obtained, a method other than using the microwave of 2.45 GHz may be employed.

Figure 5C:
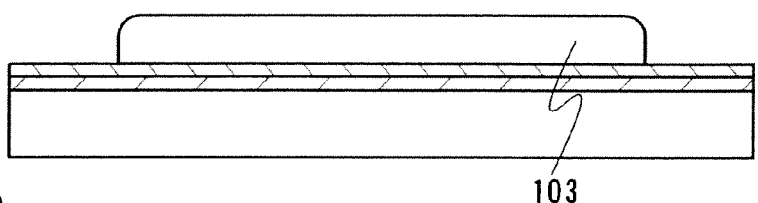

As shown in FIG. 5C, the insulating film 115 formed by the plasma treatment is removed. A method of removing the insulating film 115 can be dry etching or wet etching. For example, in a case of performing dry etching, a fluorocarbon-based gas such as $CHF_3$, $C_5F_3$, or $C_4F_5$; a chlorine-based gas such as $Cl_2$, $BCl_3$, or $SiCl_4$; a fluorine-based gas such as $CF_4$, $NF_3$, or $SF_6$; or HBr gas can be used as an etching gas. Further, an inert gas of He, Ar, Xe, or the like may be added as appropriate. Furthermore, $O_2$ gas may be added to a fluorine-based gas. By removing the insulating film 115 that is formed by performing plasma treatment on the semiconductor layer 103, the semiconductor layer 103 can be reduced in thickness. After etching, the semiconductor layer 103 is reduced in thickness, and the end portion of the semiconductor layer has curvature. In this embodiment mode, ICP etching is performed using $C_4F_8$, and He.

Figure 5D:
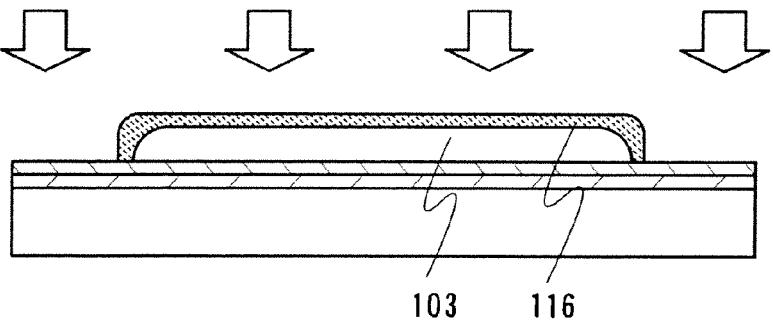

Next, as shown in FIG. 5D, a plasma treatment is performed on the semiconductor layer 103 to form an insulating film 116 on a surface of the semiconductor layer 103. A method of oxidation by plasma treatment performed on the semiconductor layer 103 is the same method used when forming the insulating film 115. By forming the insulating film 116 by performing the plasma treatment on the semiconductor layer 103, the semiconductor layer 103 can be reduced in thickness even more. The insulating film 116 can be used as a gate insulating film.

The insulating film 116 may be made into a silicon oxynitride film by performing nitridation by plasma treatment in the second plasma treatment chamber 202, and the silicon oxynitride film may be used as a gate insulating film. When performing nitridation by plasma treatment, nitrogen and argon are used as gasses introduced to the second plasma treatment chamber 202, and the temperature of the glass substrate is to be the same as that when the above-mentioned oxidation by plasma treatment is performed. Hydrogen may also be introduced in addition to nitrogen and argon, and argon may be replaced with another rare gas. Further, instead of nitrogen, a gas used when nitridation is performed by a heat treatment at high temperature, such as ammonia or $N_2O$ can be used. The insulating film 116 includes the rare gas introduced into the second plasma treatment chamber 202 at a predetermined concentration.

Nitridation by plasma treatment may be performed on the semiconductor layer 103 in the second plasma treatment chamber 202 first to form a nitride film. Further, oxidation by plasma treatment may be performed on the nitride film in the first plasma treatment chamber 201.

In an example of an insulating film that is formed by a high-density plasma treatment using the apparatus shown in FIGS. 4A and 4B, a silicon oxide layer with a thickness of 3 nm to 6 nm inclusive is formed on a surface of the semiconductor layer 103 by a plasma treatment in an atmosphere containing oxygen, and then a surface of the silicon oxide layer is treated with nitrogen plasma in an atmosphere containing nitrogen to form a nitrogen-plasma treated layer Specifically, a silicon oxide layer with a thickness of 3 nm to 6 nm inclusive is first formed on the surface of the semiconductor layer 103 by a plasma treatment in an atmosphere containing oxygen. Then, a nitrogen-plasma treated layer with a high nitrogen concentration is provided on the surface of the silicon oxide layer or in a periphery of the surface, by performing a plasma treatment in an atmosphere containing nitrogen. Note that the periphery of the surface refers to the silicon oxide layer from the surface to a depth in the range of 0.5 nm to 1.5 nm inclusive. For example, by performing the plasma treatment in an atmosphere containing nitrogen, a structure becomes that in which nitrogen is contained at a ratio of 20 atomic % to 50 atomic % inclusive in a region of the silicon oxide layer from the surface to about 1 nm in depth perpendicular to the surface. Further, a surface of the insulating film can be oxidized or nitrided by a high-density plasma treatment.

For example, by forming a silicon layer as the semiconductor layer 103 and oxidizing a surface of the silicon layer by plasma treatment, a dense oxide film that does not warp at an interface with the semiconductor layer 103 can be formed. Further, by nitriding the oxide film by plasma treatment to form a nitride film by substituting oxygen in a surface layer portion with nitrogen, an insulating layer can be even denser. In this manner, an insulating film with high withstand voltage can be formed.

In any case, by using a solid phase oxidation treatment or a solid phase nitridation treatment by plasma treatment as described above, even when a glass substrate with an allowable temperature limit of 700° C. is used, an insulating film can be obtained that is equal to an insulating film that is formed by a thermal oxidation treatment with a temperature range of 950° C. to 1050° C. inclusive. In other words, as a semiconductor element, in particular as an insulating film that serves as a gate insulating film of a thin film transistor or a non-volatile storage element, an insulating film with high reliability can be formed.

In this manner, by performing oxidation, nitridation and the like by plasma treatment on the semiconductor layer 103, the insulating film 116 is formed. Since the thickness of the semiconductor layer 103 becomes thin depending on the thickness of the insulating film that is formed, the semiconductor layer 103 can be reduced in thickness. Further, the insulating film 116 that is formed can be used as a gate insulating film.

Figure 5E:
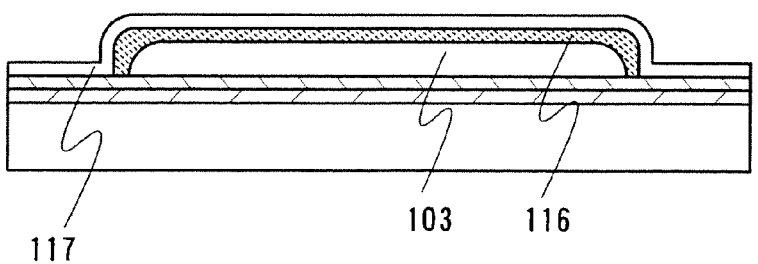

As shown in FIG. 5E, after the insulating film 116 is formed, a silicon nitride film or a silicon nitride film containing oxygen may be formed as an insulating film 117 by a CVD method or the like so that a gate insulating film is formed along with the insulating film 116. Consequently, oxidation of a gate electrode and a wiring that extends from the gate electrode that are formed later, which occurs by coming into contact with the insulating film that is made of an oxide film, can be suppressed. Further, nitridation by plasma treatment at a low electron temperature and high electron density may be performed on the above silicon nitride film or the silicon nitride film containing oxygen, for a purpose of densification or the like.

Note that the insulating film 116 can be used as a gate insulating film as a single layer, or the insulating film 117 can be used as a gate insulating film as a single layer by forming the insulating film 117 after removing the insulating film 116. In this embodiment mode, a stacked-layer structure of the insulating film 116 and the insulating film 117 is employed.

Next, a conductive layer used as a gate electrode is formed over the insulating film 116 and the insulating film 117. The conductive layer is to have a thickness of 100 nm to 500 nm inclusive. The conductive layer can be formed by a sputtering method, an evaporation method, or a CVD method. The conductive layer may be formed of an element selected from tantalum, tungsten, titanium, molybdenum, aluminum, copper, chromium, and neodymium; or an alloy material or a compound material mainly containing the element. Alternatively, a semiconductor layer typified by a polycrystalline silicon film doped with an impurity element such as phosphorus, or an AgPdCu alloy layer may be used for the conductive layer. The conductive layer may have a single-layer structure or a stacked-layer structure with two or more layers. For example, in a case of forming a three-layer structure, a 50 nm thick tungsten film as a first conductive layer, a 500 nm thick aluminum-silicon (Al—Si) alloy film as a second conductive film, and a 30 nm thick titanium nitride film as a third conductive layer may be stacked in this order. Alternatively, a tungsten nitride film may be used instead of the tungsten film in the first conductive layer, an aluminum-titanium (Al—Ti) alloy film may be used instead of the aluminum-silicon (Al—Si) alloy film in the second conductive layer, and a titanium film may be used instead of titanium nitride film in the third conductive layer.

Figure 6A:
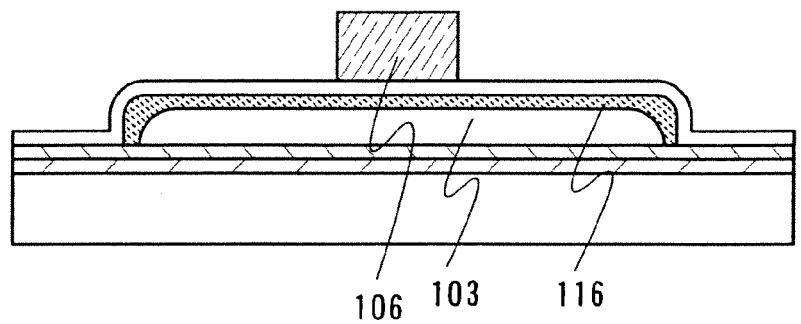
FIGS. 6A to 6C show an example of a manufacturing method of a semiconductor device according to the present invention.

Next, as shown in FIG. 6A, a mask made of a resist is formed, the conductive layer is processed into a desired shape, and the conductive layer 106 that serves as a gate electrode layer is formed. Note that as an etching gas, a chlorine-based gas typified by $Cl_2$, $BCl_3$, $SiCl_4$, or $CCl_4$; a fluorine-based gas typified by $CF_4$, $SF_6$, or $NF_3$; or $O_2$ can be used as appropriate.

Although in this embodiment mode, an example is shown in which a gate electrode is formed to have a side surface that is perpendicular to a substrate, the present invention is not limited thereto. For example, both the first conductive layer and the second conductive layer may have a tapered shape when seen from a cross section, or one of the first conductive layer and the second conductive layer may have a surface that is perpendicular to the substrate by anisotropic etching. A taper angle may be different or the same between the conductive layers that are stacked. By having a tapered shape, coverage by a film that is stacked thereover improves, and reliability improves because defects are reduced.

Figure 6B:
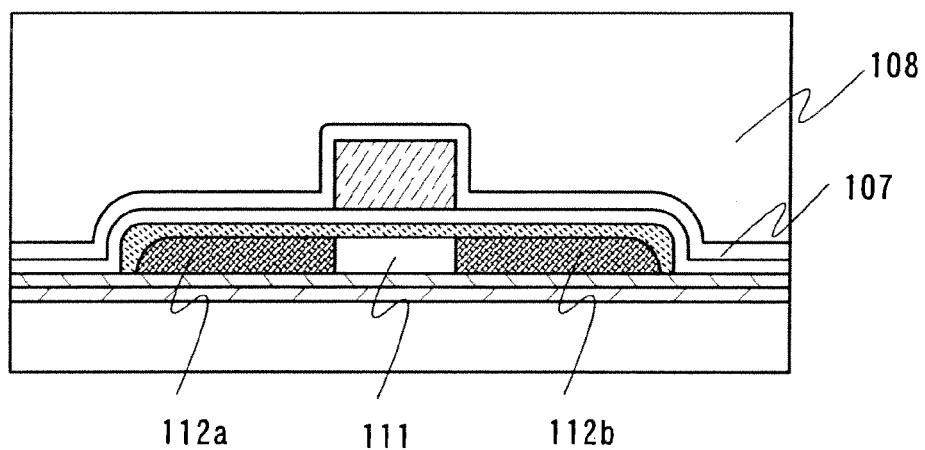

Next, as shown in FIG. 6B, an impurity element imparting one conductivity type is added using the conductive layer as a mask, to form the impurity regions 112a and 112b having one conductivity type each serving as a source region or drain region. Also, the channel-forming region 111 is formed in the semiconductor layer. Specifically, the formation method of the impurity regions shown in the embodiment mode 1 can be applied.

Next, an interlayer insulating film is formed so as to cover the insulating films and conductive layer provided over the substrate 101. In this embodiment mode, the interlayer insulating film is a stacked-layer structure of the insulating film 107 and the insulating film 108. Specifically, the formation method of the interlayer insulating film shown in the embodiment mode 1 can be applied.

Next, contact holes (opening portions) that reach the semiconductor layer 103 are formed in the insulating film 107, the insulating film 108, the insulating film 116, and the insulating film 117, using a mask made of a resist. Specifically, the formation method of the contact holes shown in the embodiment mode 1 can be applied.

Figure 6C:
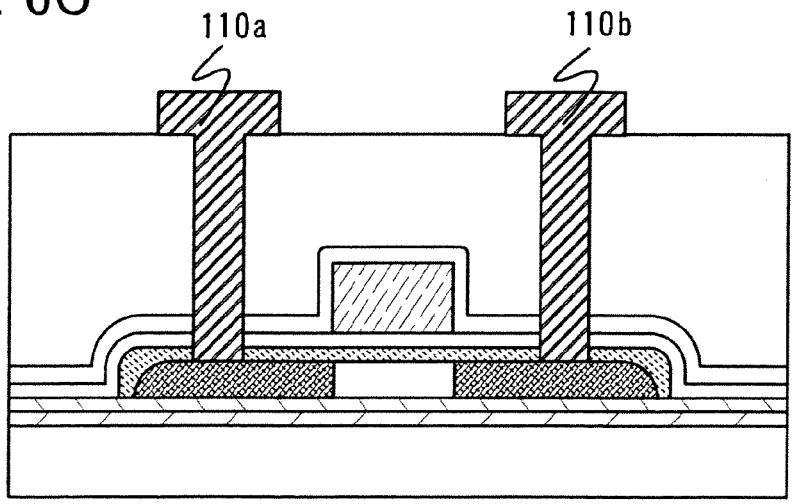

Next, as shown in FIG. 6C, a conductive layer is formed so as to cover the contact holes, and the conductive layer is etched to form the conductive layers 110a and 110b each functioning as a source electrode or a drain electrode that is electrically connected with a portion of the source region or the drain region. Specifically, the formation method of the conductive layers 110a and 110b shown in the embodiment mode 1 can be applied.

Accordingly, a thin film transistor to which the present invention is applied can be formed. Note that the structure of the transistor shown in this embodiment mode is one example, and the structure is not limited to that shown in the figures.

A characteristic of this embodiment mode, as described above, is to perform a plasma treatment with plasma of a low electron temperature and high electron density on a semiconductor layer in order to form a gate insulating film of a thin film transistor. The gate insulating film according to this embodiment mode is one for which plasma damage and crack occurrence are suppressed, and it can be formed at a temperature that does not affect the glass substrate.

In a semiconductor device according to this embodiment mode, a semiconductor layer is reduced in thickness, and a channel-forming region is formed in a region where the thickness is reduced. Consequently, since it is possible to reduce a sub-threshold value and reduce a threshold voltage of a transistor, an operation characteristic of the semiconductor device can be improved. Further, by making an end portion of the semiconductor layer have curvature along with a thinning processes of the semiconductor layer, coverage by an insulating film formed over the semiconductor layer can be improved. Accordingly, since a defect stemming from the end portion of the semiconductor layer can be reduced, a semiconductor device with high reliability can be manufactured. Therefore, a semiconductor device with enhanced performance is possible.

Note that this embodiment mode can be combined with the embodiment mode 1.

Embodiment Mode 3

In this embodiment mode, an example of manufacturing a semiconductor device by a different method from those of the above embodiment modes 1 and 2 is described with reference to 7A to 8D. Hereinafter, structures that are the same as those in the embodiment modes 1 and 2 are denoted by the same reference numerals and description thereof is omitted.

Figure 7A:
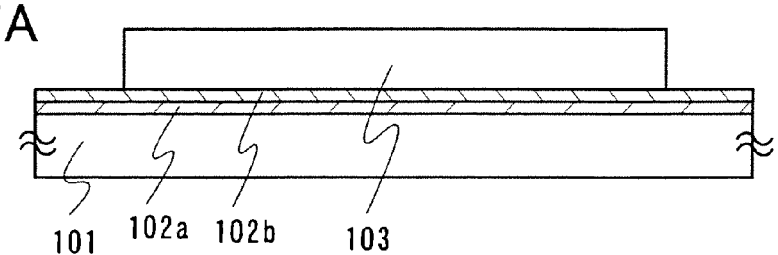
FIGS. 7A to 7F show an example of a manufacturing method of a semiconductor device according to the present invention.

As shown in FIG. 7A, up through forming the island-shaped semiconductor layer 103 over the substrate 101 with the insulating films 102a and 102b therebetween is in accordance with the description made in the above embodiment modes 1 and 2 about the substrate 101, the insulating films 102a and 102b, the semiconductor layer 103, and the like; therefore, description thereof is omitted.

Figure 7B:
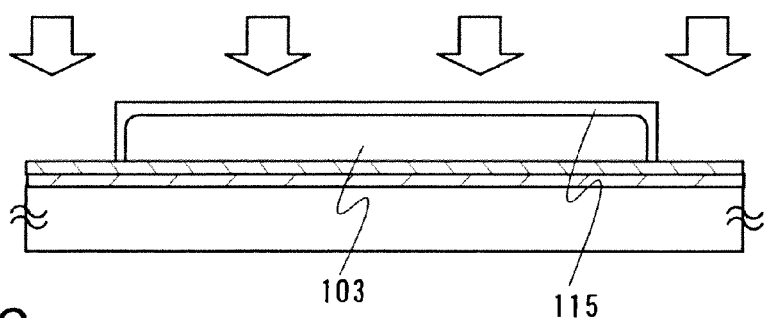

Next, as shown in FIG. 7B, the insulating film 115 is formed on a surface of the semiconductor layer 103 by performing an alteration treatment on the semiconductor layer 103. A desired treatment may be performed in a region of the semiconductor layer 103 where the insulating film 115 is to be formed. Specifically, a thermal oxidation treatment, a treatment with a solution that has strong oxidative power such as ozone water, a plasma treatment, or the like is performed on a surface of the semiconductor layer 103, so that an oxide of the semiconductor layer 103 is formed on the semiconductor layer 103. This also applies to cases of forming a nitride, an oxynitride, and a nitride oxide of the above semiconductor layer 103. Note that by performing a plasma treatment on the semiconductor layer, controlling a thickness of the insulating film 115 becomes easy.

Figure 7C:
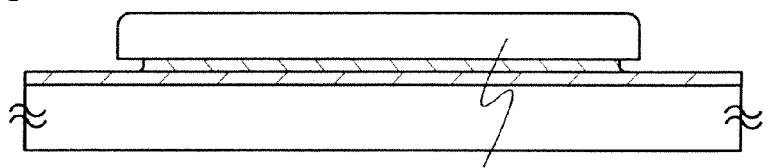

Next, as shown in FIG. 7C, the insulating film 115 is removed by etching. A method of removing the insulating film 115 may be dry etching or wet etching. For example, in a case of performing dry etching, chlorine-based gas such as $Cl_2$, $BCl_3$, or $SiCl_4$, a fluorine-based gas such as $CF_4$, $NF_3$, or $SF_6$, or HBr gas can be used as an etching gas. Further, an inert gas of He, Ar, Xe, or the like may be added as appropriate. Furthermore, $O_2$ gas may be added to a fluorine-based gas. When the insulating film 115 is etched, the insulating film 102b is also removed in a manner that digs in under the semiconductor layer 103.

Figure 7D:
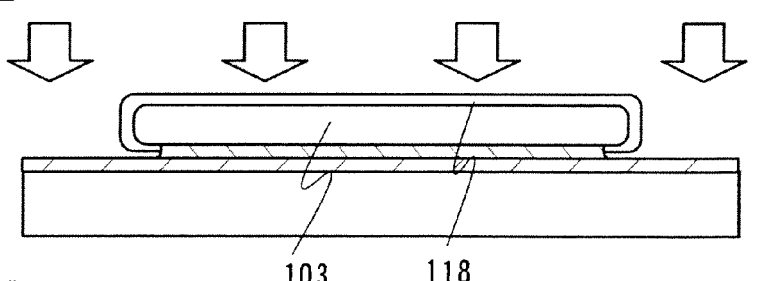

Next, as shown in FIG. 7D, an alteration treatment is further performed on the semiconductor layer 103 from which the insulating film 115 is removed, to form the insulating film 118 on the surface of the semiconductor layer 103. A method of performing the alteration treatment on the semiconductor layer 103 to form the insulating film 118 is the same as in the case of forming the insulating film 115. By performing the alteration treatment on the semiconductor layer 103 to form the insulating film 118, the semiconductor layer 103 can be reduced in thickness even more, and an upper end portion and a lower end portion of the semiconductor layer 103 can have even more curvature.

Figure 7E:
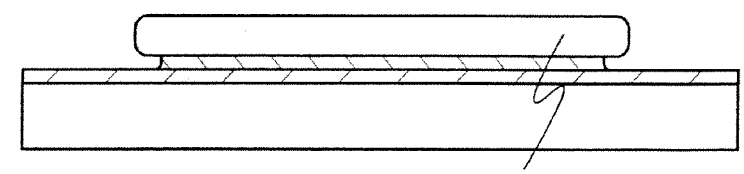

Next, as shown in FIG. 7E, the insulating film 118 is removed by etching. A method of removing the insulating film 118 is the same method of removing the insulating film 115.

Figure 7F:
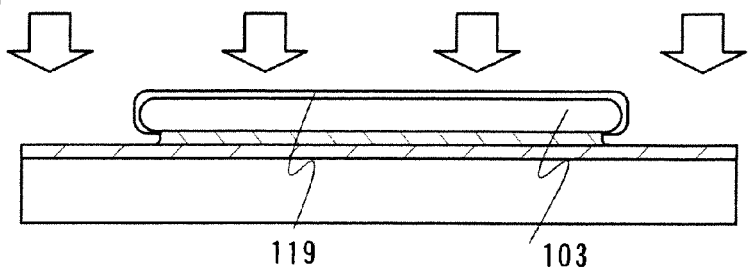

Next, as shown in FIG. 7F, an alteration treatment is performed on the semiconductor layer 103 to form an insulating film 119 on a surface of the semiconductor layer 103. A method of forming the insulating film 119 by performing an alteration treatment on the semiconductor layer 103 is the same method as the methods for forming the insulating films 115 and 118. The insulating film 119 formed in this manner can be used as a gate insulating film.

Note that when a thickness of the semiconductor layer 103 is t (t>0) and a curvature radius of a cross-section of each of the end portions of the semiconductor layer 103 is r (r>0), the relationship of t and r satisfies a conditional equation (t/4)≤r≤t.

Figure 8A:
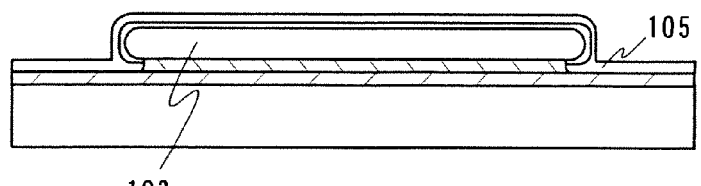
FIGS. 8A to 8D show an example of a manufacturing method of a semiconductor device according to the present invention.

Further, as shown in FIG. 8A, the insulating film 105 can be formed over the entire substrate. The insulating film 105 is formed by a CVD method or a sputtering method using a material such as silicon oxide, silicon nitride, silicon oxynitride, silicon nitride oxide, SiOF, SiOC, DLC, or porous silica. Note that the insulating film 105 may be formed over the semiconductor layer 103 without forming the insulating film 119. Alternatively, the insulating film 105 may be formed after removing the insulating film 119. By forming the insulating film 105, lower-end rim portions of the semiconductor layer 103 are covered by the insulating film 105, which alleviates concentration of an electric field in those portions. Further, upper end portions of the semiconductor layer also have curvature. By performing an alteration treatment on the semiconductor layer to form an insulating film on a surface of the semiconductor layer, coverage by the insulating film becomes good.

Figure 8B:
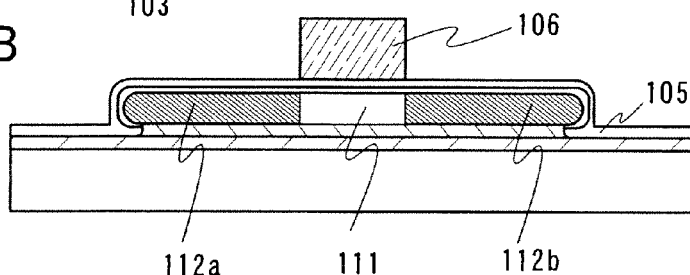

Next, the conductive layer 106 that serves as a gate electrode is formed over the semiconductor layer 103 with the insulating film 119 and the insulating film 105 interposed therebetween. An impurity element imparting one conductivity type is added to the semiconductor layer 103 using the conductive layer 106 as a mask, to form the channel-forming region 111 and the impurity regions 112a and 112b each serving as a source region or a drain region (see FIG. 8B).

The conductive layer 106 can be formed using a metal element such as tantalum, tungsten, titanium, molybdenum, chromium, aluminum, copper, or niobium, or an alloy material or a compound material containing the metal element. Alternatively, the conductive layer can be formed using a semiconductor material typified by polycrystalline silicon to which an impurity element imparting one conductivity type such as phosphorus is added. The conductive layer 106 serving as a gate electrode can be formed as a single-layer structure or a stacked-layer structure using one or a plurality of these materials. A thickness of the conductive layer 106 is formed in a range of 100 nm to 1000 nm inclusive, preferably 200 nm to 800 nm inclusive, and more preferably 300 nm to 500 nm inclusive. Further, the conductive layer 106 that serves as a gate electrode may be formed over an entire surface by a CVD method or a sputtering method using the above material and then processed into a desired shape by selective etching.

Next, an impurity element imparting one conductivity type is added using the conductive layer 106 as a mask, to form the impurity regions 112a and 112b having one conductivity type each serving as a source region or a drain region. Further, the channel-forming region 111 is formed in the semiconductor layer. Specifically, the formation method of the impurity regions 112a and 112b shown in the embodiment mode 1 can be applied.

Figure 8C:
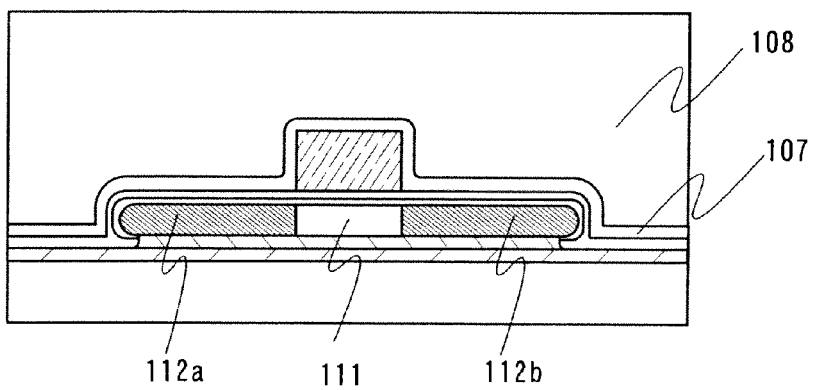

Next, as shown in FIG. 8C, an interlayer insulating film is formed so as to cover the insulating films and conductive layer provided over the substrate 101. In this embodiment mode, the interlayer insulating film has a stacked-layer structure of the insulating film 107 and the insulating film 108. Specifically, the formation method of the interlayer insulating film shown in the embodiment mode 1 can be applied.

Figure 8D:
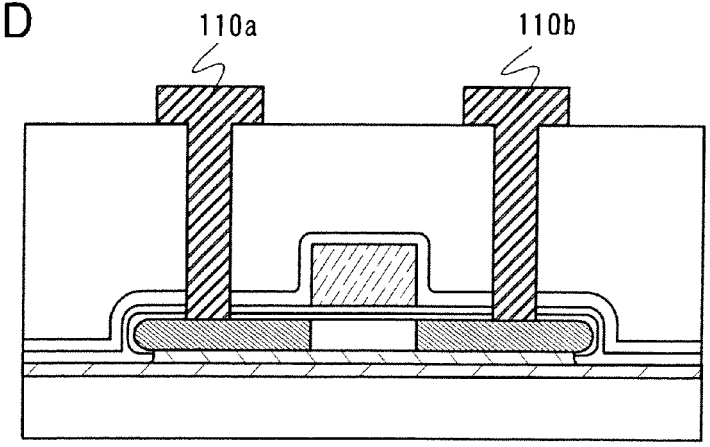

Next, as shown in FIG. 8D, using a mask made of a resist, contact holes (opening portions) that reach the semiconductor layer 103 is formed in the insulating film 119, the insulating film 105, the insulating film 107, and the insulating film 108. Specifically, the formation method of the contact holes shown in the embodiment mode 1 can be applied.

Then, a conductive layer is formed so as to cover the contact holes, and the conductive layer is etched to form the conductive layers 110a and 110b each functioning as a source electrode or a drain electrode that is electrically connected with portion of the source region or the drain region. Specifically, the formation method of the conductive layers 110a and 110b shown in the embodiment mode 1 can be applied.

By the above process, a semiconductor device containing a thin film transistor can be manufactured (see FIG. 8D).

In a semiconductor device according to this embodiment mode, a semiconductor layer is reduced in thickness, and a channel-forming region is formed in a region where the thickness is reduced. Consequently, since it is possible to reduce a sub-threshold value and reduce a threshold voltage of a transistor, an operation characteristic of the semiconductor device can be improved. Further, by making an end portion of the semiconductor layer have curvature by a thinning process of the semiconductor layer, coverage by an insulating film formed over the semiconductor layer can be improved. Accordingly, since a defect stemming from the end portion of the semiconductor layer can be reduced, a semiconductor device with high reliability can be manufactured. Therefore, a semiconductor device with enhanced performance is possible.

Embodiment Mode 4

A semiconductor device according to the present invention can be applied to an integrated circuit such as a central processing unit (CPU). In this embodiment mode, an example of a CPU to which the semiconductor device described in the above embodiment modes 1 to 3 is described below with reference to drawings.

Figure 9:
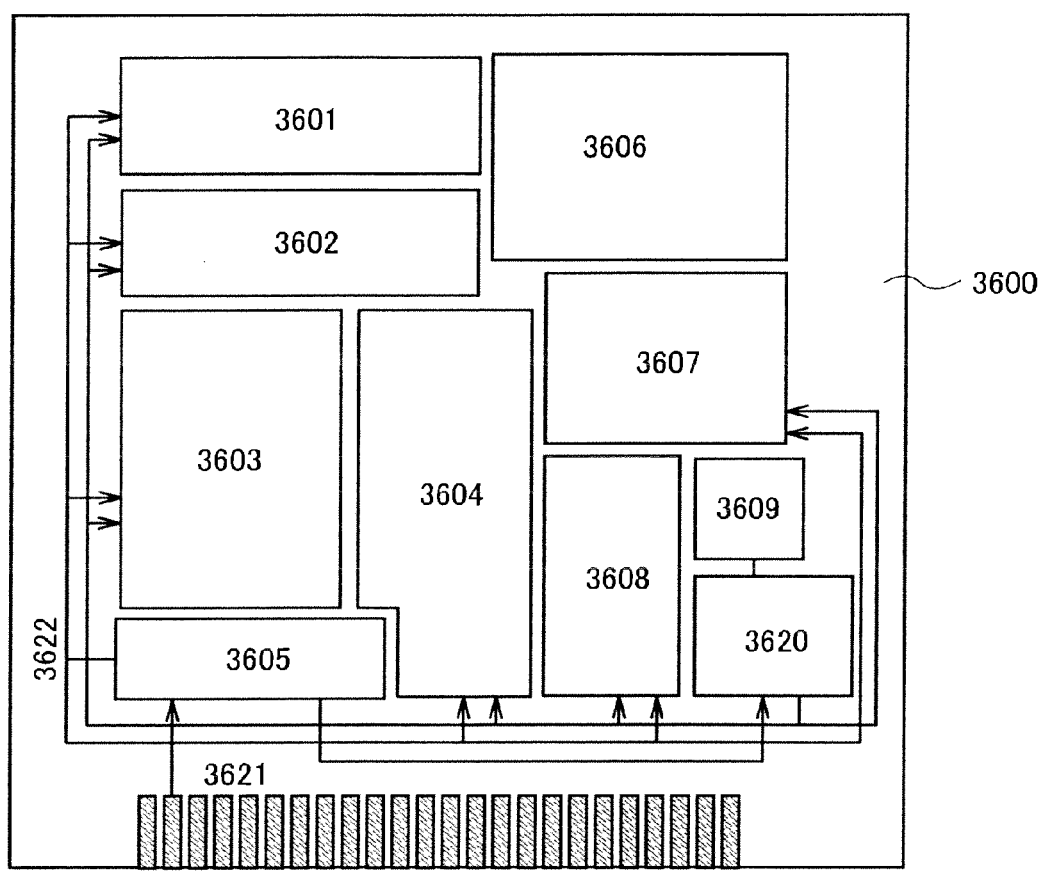
FIG. 9 is a block diagram showing an example of a semiconductor device according to the present invention.

A CPU 3660 shown in FIG. 9 mainly includes over a substrate 3600 an arithmetic logic unit (ALU) 3601, an ALU controller 3602, an instruction decoder 3603, an interrupt controller 3604, a timing controller 3605, a register 3606, a register controller 3607, a bus interface (Bus I/F) 3608, a rewritable ROM 3609, and a ROM interface (ROM I/F) 3620. Alternatively, the ROM 3609 and the ROM interface 3620 may be provided over a different chip. Such various circuits included in the CPU 3660 can be formed by using the thin film transistor described in any of the embodiment modes 1 to 3, or a CMOS transistor, an nMOS transistor, a pMOS transistor, or the like formed by combining the thin film transistors.

Note that the CPU 3660 shown in FIG. 9 is merely one example that is shown with a simplified structure, and an actual CPU has a variety of structures depending on usage. Therefore, a structure of the CPU to which the present invention is applied is not limited to that shown in FIG. 9.

An instruction input to the CPU 3660 through the bus interface 3608 is input to the instruction decoder 3603 and decoded, and then input to the ALU controller 3602, the interrupt controller 3604, the register controller 3607, and the timing controller 3605.

The ALU controller 3602, the interrupt controller 3604, the register controller 3607, and the timing controller 3605 perform various controls based on a decoded instruction. Specifically, the ALU controller 3602 generates a signal to control driving of the ALU 3601. The interrupt controller 3604 judges an interruption request from an input/output device outside or a peripheral circuit based on priority or a mask state and processes the interruption request, during program execution of the CPU 3660. The register controller 3607 generates an address of the register 3606, and performs reading or writing in the register 3606 depending on a state of the CPU.

Further, the timing controller 3605 generates a signal to control driving timing of the ALU 3601, the ALU controller 3602, the instruction decoder 3603, the interrupt controller 3604, and the register controller 3607. For example, the timing controller 3605 is provided with an internal clock generator that generates an internal clock signal CLK 2 (3622) based on a reference clock signal CLK 1 (3621), and supplies the internal clock signal CLK 2 to each of the above circuits.

Figure 10:
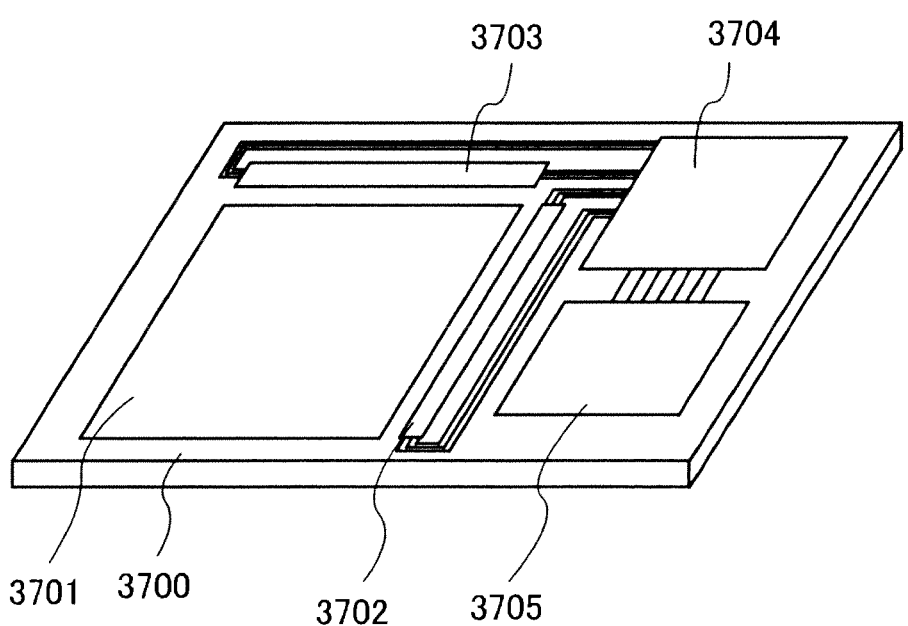
FIG. 10 is perspective view showing an example of a semiconductor device according to the present invention.

FIG. 10 shows a display device in which a pixel portion, a CPU, and other circuits are formed over one substrate, in other words a system-on-panel. Over a substrate 3700, a pixel portion 3701, a scan line driver circuit 3702 that selects a pixel included in the pixel portion 3701, and a signal line driver circuit 3703 that supplies a video signal to a selected pixel are provided. The CPU 3704 and another circuit, for example the control circuit 3705, are connected by wires that extend from the scan line driver circuit 3702 and the signal line driver circuit 3703. Note that an interface is included in the control circuit 3705. Further, a connection portion to an FPC terminal is provided at an end portion of the substrate 3700 to perform communication with an external signal.

As the other circuit, a video signal processing circuit, a power source circuit, a gray scale power source circuit, a video RAM, a memory (DRAM, SRAM, PROM) or the like can be provided in addition to the control circuit 3705. The other circuit may be included in an IC chip and then mounted on the substrate. In addition, the scan line driver circuit 3702 and the signal line driver circuit 3703 do not necessarily have to be formed over the same substrate. For example, just the scan line driver circuit 3702 may be formed over the same substrate and the signal line driver circuit 3703 may be included in an IC chip and then mounted.

Note that although in this embodiment mode, an example of applying the semiconductor device according to the present invention to a CPU is described, the present invention is not limited thereto. For example, the semiconductor device according to the present invention can be applied to a pixel portion, a driver circuit portion, and the like of a display device provided with an organic light-emitting element, an inorganic light-emitting element, a liquid crystal element, or the like. Other than that, by applying the present invention, a digital camera; a sound reproduction device such as a car stereo system; an image reproduction device provided with a recording medium such as a laptop computer, a game machine, a portable information terminal (such as a portable phone or a portable game machine), or a domestic game machine; or the like can be manufactured.

A semiconductor device to which the present invention is applied can have good electrical characteristics of a conductive layer and a semiconductor layer. Accordingly, reliability of the semiconductor device can be improved.

Embodiment Mode 5

In this embodiment mode, one example of a usage mode of the semiconductor device described in the preceding embodiment modes will be described. Specifically, an application example of a semiconductor device to/from which data can be input/output without contact will be described below with reference to the drawings. The semiconductor device to/from which data can be input/output without contact is also called an RFID tag, an ID tag, an IC tag, an IC chip, an RF tag, a wireless tag, an electronic tag, or a wireless chip depending on the usage mode.

One example of a top structure of a semiconductor device described in this embodiment mode is described with reference to FIG. 11A. A semiconductor device 2180 shown in FIG. 11A includes a thin film integrated circuit 2131 including a plurality of elements such as thin film transistors for forming a memory portion and a logic portion, and a conductive layer 2132 which serves as an antenna. The conductive layer 2132 which serves as an antenna is electrically connected to the thin film integrated circuit 2131. The semiconductor device according to the present invention described in any of the embodiment modes 1 to 4 can be applied to the thin film integrated circuit 2131.

Figure 11A:
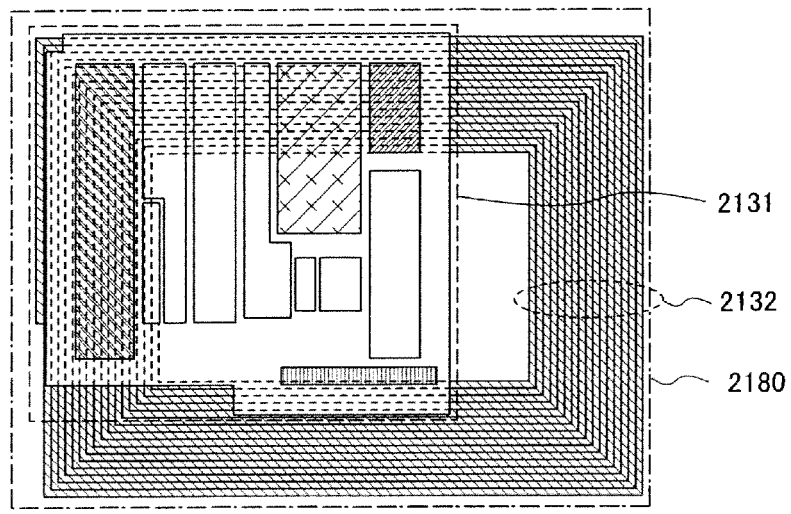
FIG. 11A is an example of a top structure of a semiconductor device and FIGS. 11B and 11C show schematic cross-sectional views of FIG. 11A according to the present invention.
Figure 11B:
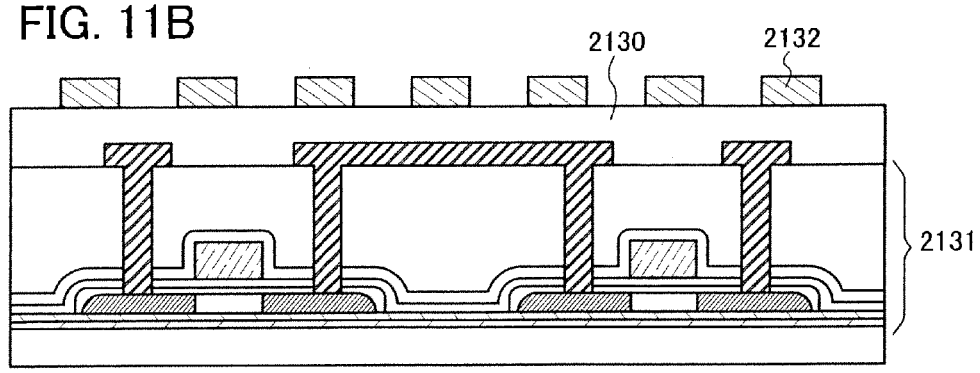
Figure 11C:
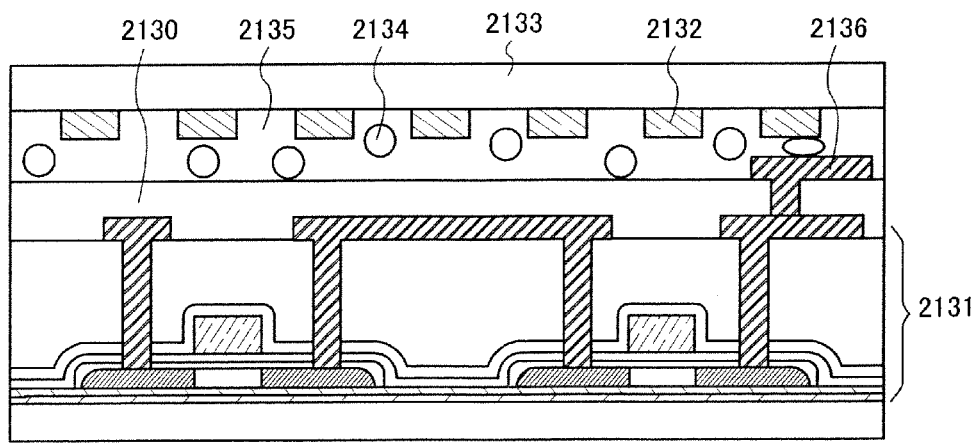

Schematic cross-sectional views of FIG. 11A are shown in FIGS. 11B and 11C. The conductive layer 2132 which serves as an antenna is provided above the elements for forming the memory portion and the logic portion. For example, the conductive layer 2132 which serves as an antenna can be provided above the thin film integrated circuit 2131 with an insulating film 2130 interposed therebetween (see FIG. 11B). Alternatively, the conductive layer 2132 which serves as an antenna may be provided over a substrate 2133 and then the substrate 2133 and the thin film integrated circuit 2131 may be attached to each other so as to sandwich the conductive layer 2132 (see FIG. 11C). The example in which a conductive layer 2136 provided over the insulating film 2130 and the conductive layer 2132 which serves as an antenna are electrically connected to each other with conductive particles 2134 contained in an adhesive resin 2135 is shown in FIG. 11C.

Note that in this embodiment mode, although the example in which the conductive layer 2132 which serves as an antenna is provided in the shape of a coil and either an electromagnetic induction method or an electromagnetic coupling method is employed is described, the semiconductor device of the present invention is not limited thereto, and a microwave method may be employed as well. In the case of a microwave method, the shape of the conductive layer 2132 which serves as an antenna may be decided as appropriate depending on the wavelength of an electromagnetic wave.

Figure 12A:
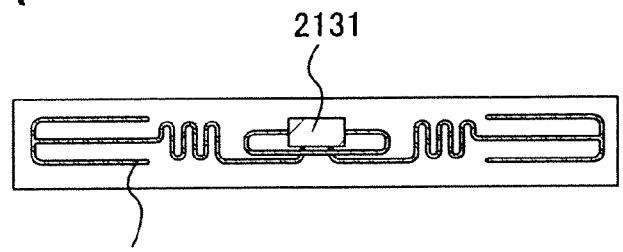
FIGS. 12A to 12D show antennas that can be applied to a semiconductor device according to the present invention.
Figure 12B:
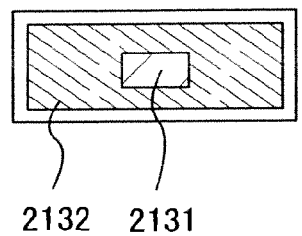
Figure 12C:
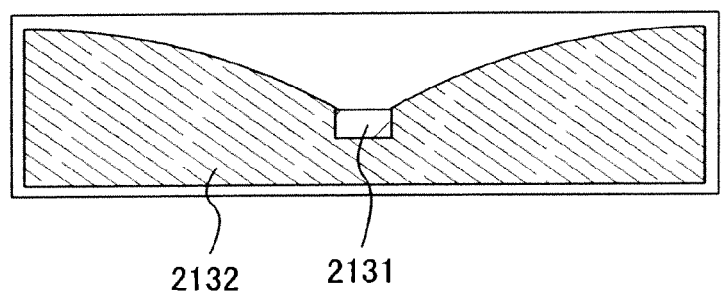
Figure 12D:
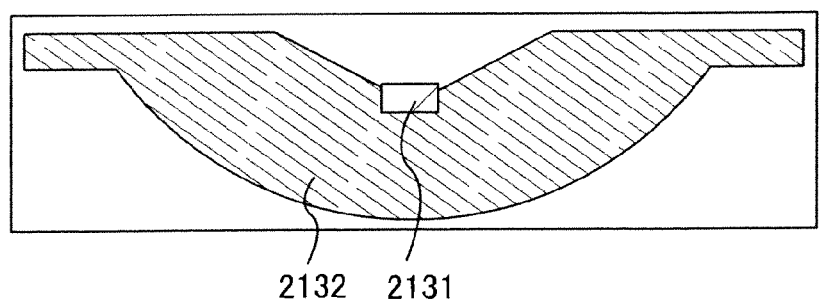

For example, when the microwave method (e with an UHF band (in the range of 860 to 960 MHz inclusive a frequency band of 2.45 GHz, or the like) is employed as the signal transmission method of the semiconductor device 2180, the shape such as the length of the conductive layer 2132 which serves as an antenna may be set as appropriate in consideration of the wavelength of an electromagnetic wave used in sending a signal. For example, the conductive layer 2132 which serves as an antenna can be formed into a shape of a line (e.g., a dipole antenna (see FIG. 12A)), into a flat shape (e.g., a patch antenna (see FIG. 12B)), into a shape of a ribbon (FIGS. 12C and 12D), or the like. Further, the shape of the conductive layer 2132 which serves as an antenna is not limited to a line, and the conductive layer in the shape of a curved line, in an S-shape, or in a shape combining them may be provided as well in consideration of the wavelength of the electromagnetic wave.

The conductive layer 2132 which serves as an antenna is formed of a conductive material by a CVD method, a sputtering method, a printing method such as a screen printing method or a gravure printing method, a droplet discharging method, a dispenser method, a plating method, or the like. As the conductive material, a metal element such as aluminum, titanium, silver, copper, gold, platinum, nickel, palladium, tantalum, molybdenum, or the like, or an alloy material or a compound material mainly containing the element is used, and the conductive layer 2132 employs a single-layer structure or a stacked-layer structure.

For example, when the conductive layer 2132 which serves as an antenna is formed by a screen printing method, it can be provided by selectively printing a conductive paste in which conductive particles with a grain diameter of several nm to several tens of μm are dissolved or dispersed in an organic resin. As the conductive particle, at least one of metal particles such as silver, gold, copper, nickel, platinum, palladium, tantalum, molybdenum, titanium, and the like; fine particles of silver halide; or dispersive nanoparticles can be used. Further, as the organic resin included in the conductive paste, at least one of organic resins which function as a binder, a solvent, a dispersing agent, and a coating material of metal particles can be used. Typically, an organic resin such as an epoxy resin and a silicon resin can be given as an example. Further, in forming the conductive layer 2132, it is preferable to bake the conductive paste after providing it. For example, in the case of using fine particles (e.g., with a grain diameter of 1 to 100 nm, inclusive) mainly containing silver as a material of the conductive paste, the conductive layer 2132 can be formed by baking the conductive paste at a temperature in the range of 150 to 300° C. inclusive to harden it. Alternatively, fine particles mainly containing solder or lead-free solder may be used. In this case, fine particles with a grain diameter of less than or equal to 20 μm are preferably used. Solder and lead-free solder have the advantage of low cost.

Next, an operation example of the semiconductor device according to this embodiment mode is described with reference to FIG. 13A.

Figure 13A:
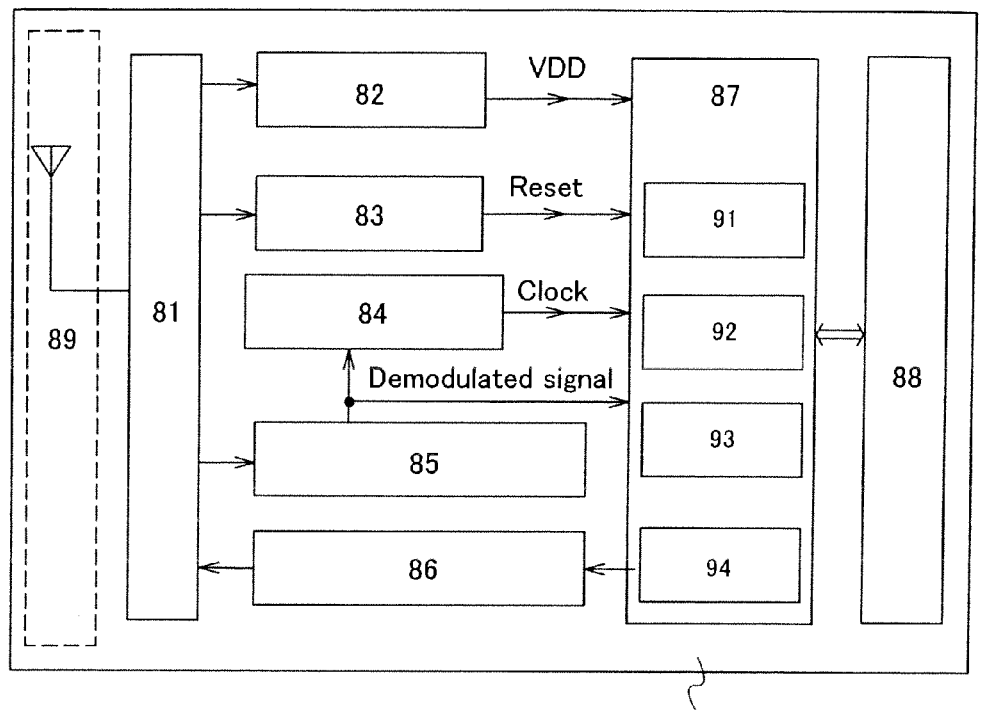
FIGS. 13A to 13C are a block diagram showing an example of a semiconductor device according to the present invention and diagrams showing usage examples thereof.

The semiconductor device 2180 shown in FIG. 13A has a function of exchanging data without contact, and includes a high-frequency circuit 81, a power source circuit 82, a reset circuit 83, a clock generating circuit 84, a data demodulating circuit 85, a data modulating circuit 86, a control circuit 87 for controlling other circuits, a memory circuit 88, and an antenna 89. The high-frequency circuit 81 is a circuit that receives a signal from the antenna 89, and outputs a signal that is received from the data modulating circuit 86 through the antenna 89. The power source circuit 82 is a circuit that generates a power source potential from a received signal. The reset circuit 83 is a circuit that generates a reset signal. The clock generating circuit 84 is a circuit that generates various clock signals based on a received signal input from the antenna 89. The data modulating circuit 86 is a circuit that modulates a signal received from the control circuit 87. As the control circuit 87, for example, a code extracting circuit 91, a code judging circuit 92, a CRC judging circuit 93, and an output unit circuit 94 are provided. Note that the code extracting circuit 91 extracts each of a plurality of codes included in an instruction sent to the control circuit 87. The code judging circuit 92 judges the content of the instruction by comparing each extracted code with a code corresponding to a reference. The CRC judging circuit 93 detects whether or not there is a transmission error or the like based on a judged code. In FIG. 13A, in addition to the control circuit 87, the high-frequency circuit 81 and the power source circuit 82 which are analog circuits are included.

Next, one example of an operation of the aforementioned semiconductor device is described. First, a wireless signal is received by the antenna 89 and then sent to the power source circuit 82 through the high-frequency circuit 81, so that a high power source potential (hereinafter referred to as "VDD") is generated. VDD is supplied to each circuit in the semiconductor device 2180. A signal sent to the data demodulating circuit 85 through the high-frequency circuit 81 is demodulated (hereinafter this signal is called a "demodulated signal"). Moreover, signals that passes through the reset circuit 83 and the clock generating circuit 84 through the high-frequency circuit 81, and the demodulated signal are sent to the control circuit 87. The signals sent to the control circuit 87 are analyzed by the code extracting circuit 91, the code judging circuit 92, the CRC judging circuit 93, and the like. Then, based on the analyzed signals, information of the semiconductor device stored in the memory circuit 88 is output. The output information of the semiconductor device is encoded through the output unit circuit 94. Further, the encoded information of the semiconductor device 2180 passes through the data modulating circuit 86 and then is sent by the antenna 89 as a wireless signal. Note that a low power source potential (hereinafter called "VSS") is common in the plurality of circuits included in the semiconductor device 2180 and GND can be used as VSS.

In this manner, by sending a signal from a communication unit (e.g., a reader/writer or a unit having a function of a reader or a writer) to the semiconductor device 2180 and receiving a signal sent from the semiconductor device 2180 by the reader/writer, data of the semiconductor device can be read.

Further, in the semiconductor device 2180, a power source voltage may be supplied to each circuit by electromagnetic waves without providing a power source (a battery), or a power source (battery) may be provided so that a power source voltage is supplied to each circuit by both electromagnetic waves and the power source (battery).

Figure 13B:
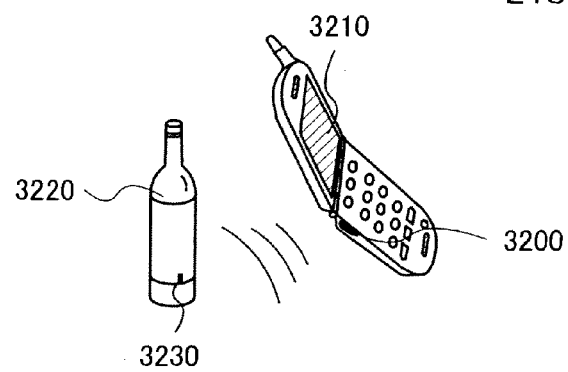
Figure 13C:
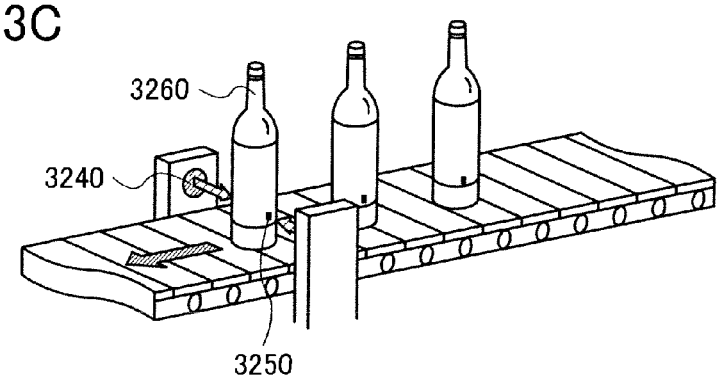
Figure 14A:
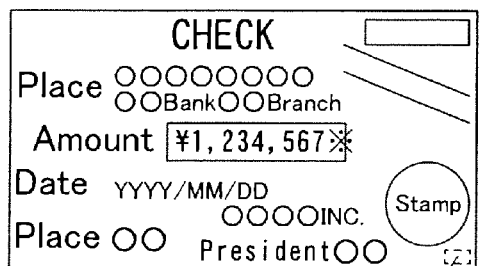
FIGS. 14A to 14H each shows a usage example of a semiconductor device according to the present invention.
Figure 14B:
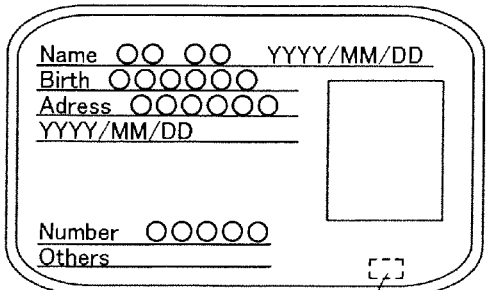
Figure 14C:
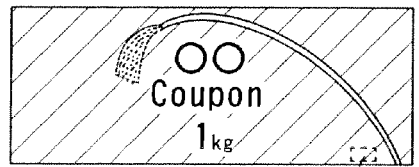
Figure 14D:
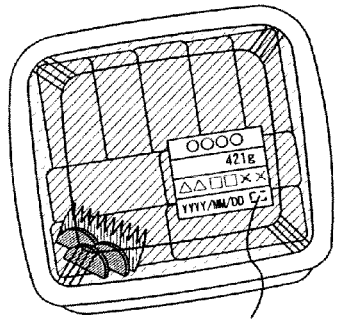
Figure 14E:
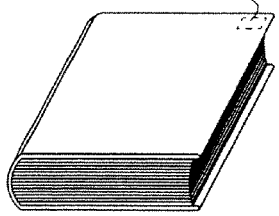
Figure 14F:
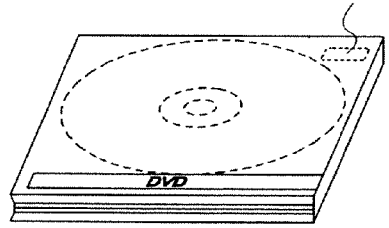
Figure 14G:
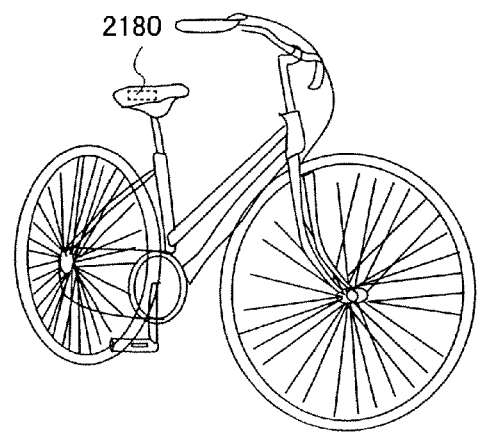
Figure 14H:
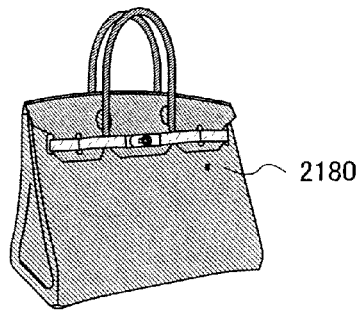

Next, one example of usage modes of the semiconductor device to/from which data can be input/output without contact is described. The side surface of a mobile terminal including a display portion 3210 is provided with a communication unit 3200, and the side surface of a product 3220 is provided with a semiconductor device 3230 (see FIG. 13B). Note that the communication unit 3200 has a function of reading and transmitting a signal like a reader/writer, or has only a function of reading a signal or transmitting a signal. When the communication unit 3200 is held over the semiconductor device 3230 included in the product 3220, the display portion 3210 displays information on the product, such as a raw material, a place of origin, an inspection result for each production step, a history of distribution process, description of the product, or the like. Further, while a product 3260 is transferred by a conveyer belt, the product 3260 can be inspected by using a reader/writer 3240 and a semiconductor device 3250 provided for the product 3260 (see FIG. 13C). As the semiconductor devices 3230 and 3250, the aforementioned semiconductor device 2180 can be applied. In this manner, by using the semiconductor device according to the present invention in the system, information can be obtained easily and higher performance and a high added value are achieved. Further, since the semiconductor device according to the present invention has high reliability, a malfunction or the like of a semiconductor device provided for a product can be prevented.

Note that an applicable range of the semiconductor device according to the present invention is wide in addition to the above, and the semiconductor device can be applied to any product as long as it clarifies information of an object, such as the history thereof, without contact and is useful for production, management, or the like. For example, the semiconductor device can be provided for bills, coins, securities, certificates, bearer bonds, packing containers, books, recording media, personal belongings, vehicles, food, clothing, health products, commodities, medicine, electronic devices, and the like. Examples of them are described with reference to FIGS. 14A to 14H.

The bills and coins are money distributed to the market, and include one valid in a certain area (a cash voucher), memorial coins, and the like. The securities refer to checks, certificates, promissory notes, and the like (see FIG. 14A). The certificates refer to driver's licenses, certificates of residence, and the like (see FIG. 14B). The bearer bonds refer to stamps, rice coupons, various gift certificates, and the like (see FIG. 14C). The packing containers refer to wrapping paper for food containers and the like, plastic bottles, and the like (see FIG. 14D). The books refer to hardbacks, paperbacks, and the like (see FIG. 14E). The recording media refer to DVD software, video tapes, and the like (see FIG. 14F). The vehicles mean a wheeled vehicle such as a bicycle, a vessel and the like (see FIG. 14G). The personal belongings refer to bags, glasses, and the like (see FIG. 14H). The food refers to food articles, drink, and the like. The clothing refers to clothes, footwear, and the like. The health products refer to medical instruments, health instruments, and the like. The commodities refer to furniture, lighting equipment, and the like. The medicine refers to medical products, pesticides, and the like. The electronic devices refer to liquid crystal display devices, EL display devices, television devices (TV sets and flat-panel TV sets), cellular phones, and the like.

Forgery can be prevented by providing the semiconductor device 2180 for the bills, the coins, the securities, the certificates, the bearer bonds, or the like. Further, the efficiency of an inspection system, a system used in a rental shop, or the like can be improved by providing the semiconductor device 2180 for the packing containers, the books, the recording media, the personal belongings, the food, the commodities, the electronic devices, or the like. Forgery or theft can be prevented by providing the semiconductor device 2180 for the vehicles, the health products, the medicine, or the like; and in the case of the medicine, medicine can be prevented from being taken mistakenly. The semiconductor device 2180 can be provided by being attached to the surface or being embedded in the object. For example, in the case of a book, the semiconductor device 2180 may be embedded in the paper; and in the case of a package made of an organic resin, the semiconductor device 2180 may be embedded in the organic resin.

As described above, the efficiency of an inspection system, a system used for a rental product, or the like can be improved by providing the semiconductor device 2180 for the packing containers, the recording media, the personal belonging, the food, the clothing, the commodities, the electronic devices, or the like. Further, by providing the semiconductor device 2180 for the vehicles or the like, forgery or theft thereof can be prevented. Further, by implanting the semiconductor device 2180 in a creature such as an animal, an individual creature can be easily identified. For example, by implanting/attaching the semiconductor device with a sensor into a creature such as livestock, its health condition such as body temperature as well as its birth year, sex, breed, or the like can be easily managed.

Note that this embodiment mode can be freely combined with the preceding embodiment modes.

This application is based on Japanese Patent Application serial no. 2007-155620 filed with Japan Patent Office on Jun. 12, 2007, the entire contents of which are hereby incorporated by reference.

What is claimed is:

1. A semiconductor device comprising:
a substrate having an insulating surface,
an island-shaped semiconductor layer provided over the substrate;
an insulating film formed so as to cover the island-shaped semiconductor layer; and
a conductive layer provided over the island-shaped semiconductor layer with the insulating film interposed therebetween,
wherein an upper end portion of a cross-section of the island-shaped semiconductor layer has curvature,
wherein the island-shaped semiconductor layer has a film thickness of 10 nm to 30 nm inclusive, and
wherein when a film thickness of the island-shaped semiconductor layer is t (t>0) and a curvature radius of an end portion of a cross-section of the island-shaped semiconductor layer is r (r>0), a relationship of t and r satisfies a conditional equation $(t/4) \leq r \leq t$.

2. A semiconductor device comprising:
a substrate having an insulating surface;
an island-shaped semiconductor layer provided over the substrate;
an insulating film formed so as to cover the island-shaped semiconductor layer; and
a conductive layer provided over the island-shaped semiconductor layer with the insulating film interposed therebetween,
wherein an upper end portion and a lower end portion of a cross-section of the island-shaped semiconductor layer have curvature,
wherein the island-shaped semiconductor layer has a film thickness of 10 nm to 30 nm inclusive, and
wherein when a film thickness of the island-shaped semiconductor layer is t (t>0) and a curvature radius of an end portion of a cross-section of the island-shaped semiconductor layer is r (r>0), a relationship of t and r satisfies a conditional equation $(t/4) \leq r \leq t$.

3. The semiconductor device according to claim 1, wherein the insulating film has a film thickness of 1 nm to 10 nm inclusive.

4. The semiconductor device according to claim 1, wherein the insulating film includes a material of the island-shaped semiconductor layer.

5. The semiconductor device according to claim 2, wherein the insulating film has a film thickness of 1 nm to 10 nm inclusive.

6. The semiconductor device according to claim 2, wherein the insulating film includes a material of the island-shaped semiconductor layer.

* * * * *

UNITED STATES PATENT AND TRADEMARK OFFICE
CERTIFICATE OF CORRECTION

PATENT NO. : 8,921,902 B2  
APPLICATION NO. : 13/851122  
DATED : December 30, 2014  
INVENTOR(S) : Satoru Okamoto Page 1 of 1

It is certified that error appears in the above-identified patent and that said Letters Patent is hereby corrected as shown below:

In the Specification:

Col. 6, line 41, "1126" should read --112b--

Col. 13, line 63, "harrier layer" should read --barrier layer--

Col. 14, line 2, "1106" should read --110b--

Col. 16, line 2, "($H_2O_2$)" should read --($H_2/O_2$)--

Col. 16, line 23, "FIG. 513" should read --FIG. 5B--

Col. 24, line 43, "(e with an UHF" should read --(e.g., with an UHF--

Col. 24, line 44, "inclusive a frequency" should read --inclusive, a frequency--

Signed and Sealed this  
Eleventh Day of August, 2015

Michelle K. Lee  
*Director of the United States Patent and Trademark Office*